US011382209B2

(12) United States Patent
Hasegawa et al.

(10) Patent No.: US 11,382,209 B2
(45) Date of Patent: Jul. 5, 2022

(54) METHOD FOR MANUFACTURING PRINTED CIRCUIT BOARD, PRINTED CIRCUIT BOARD, AND ELECTRONIC DEVICE

(71) Applicant: CANON KABUSHIKI KAISHA, Tokyo (JP)

(72) Inventors: Mitsutoshi Hasegawa, Yokohama (JP); Kunihiko Minegishi, Yokohama (JP); Takashi Sakaki, Inagi (JP); Shingo Ishiguri, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/398,405

(22) Filed: Apr. 30, 2019

(65) Prior Publication Data
US 2019/0342991 A1 Nov. 7, 2019

(30) Foreign Application Priority Data

May 7, 2018 (JP) .............................. JP2018-089514
Apr. 1, 2019 (JP) .............................. JP2019-069932

(51) Int. Cl.
*H05K 1/11* (2006.01)
*H05K 1/18* (2006.01)
(Continued)

(52) U.S. Cl.
CPC ..... *H05K 1/0274* (2013.01); *H01L 27/14636* (2013.01); *H04N 5/2253* (2013.01);
(Continued)

(58) Field of Classification Search
CPC .... H05K 1/0274; H05K 3/3457; H05K 5/006; H05K 1/11; H04N 5/2253; H01L 27/14636; H01L 27/14618
See application file for complete search history.

(56) References Cited

U.S. PATENT DOCUMENTS 6,489,637 B1 * 12/2002 Sakamoto ........... H01L 25/0753
257/100
6,548,832 B1 * 4/2003 Sakamoto ........... H01L 25/0753
257/81
(Continued)

FOREIGN PATENT DOCUMENTS

JP 2006-186011 A 7/2006

OTHER PUBLICATIONS

Ishiguri et al., U.S. Appl. No. 16/426,464, filed May 30, 2019.

*Primary Examiner* — Ishwarbhai B Patel
(74) *Attorney, Agent, or Firm* — Venable LLP

(57) ABSTRACT

A printed circuit board includes an electronic component including a first base and a plurality of first lands, the first base including a first main surface, the plurality of first lands being disposed around a first portion of the first main surface and spaced from each other, a printed wiring board including a second base and a plurality of second lands, the second base including a second main surface, the plurality of second lands being disposed around a second portion of the second main surface and spaced from each other, bonding portions configured to bond the first lands and the second lands, a resin portion configured to cover the bonding portions and including cured thermosetting resin, and a member having a property to repel uncured thermosetting resin and disposed on one of the first portion and the second portion.

21 Claims, 23 Drawing Sheets

(51) Int. Cl.
*H05K 1/02* (2006.01)
*H01L 27/146* (2006.01)
*H04N 5/225* (2006.01)
*H05K 5/00* (2006.01)
*H05K 3/34* (2006.01)

(52) U.S. Cl.
CPC ............ *H05K 1/11* (2013.01); *H05K 1/18* (2013.01); *H05K 3/3457* (2013.01); *H05K 5/006* (2013.01)

(56) References Cited

U.S. PATENT DOCUMENTS

| | | |
|---|---|---|
| 6,775,899 B1 * | 8/2004 | Tomomatsu .......... G06T 7/0006 29/593 |
| 7,966,721 B2 | 6/2011 | Wada et al. |
| 10,076,037 B2 | 9/2018 | Minegishi |
| 2006/0163724 A1 * | 7/2006 | Hwang .................. H01L 24/83 257/737 |
| 2007/0077367 A1 * | 4/2007 | Miura ................ B41J 11/00218 427/532 |
| 2010/0033647 A1 * | 2/2010 | Okita ................ H01L 27/14601 349/57 |
| 2012/0012876 A1 * | 1/2012 | Katoh .................... H01L 33/44 257/98 |
| 2012/0188735 A1 * | 7/2012 | Hiroshima ............. H05K 1/181 361/767 |
| 2013/0186960 A1 * | 7/2013 | Suzuki ................ H01L 23/3107 235/492 |
| 2018/0092211 A1 * | 3/2018 | Minegishi .............. H05K 1/111 |
| 2018/0158989 A1 * | 6/2018 | Yamane .................. H01L 33/54 |
| 2018/0242462 A1 | 8/2018 | Minegishi et al. |

\* cited by examiner

S31

S32-1

S32-2

S33

METHOD FOR MANUFACTURING PRINTED CIRCUIT BOARD, PRINTED CIRCUIT BOARD, AND ELECTRONIC DEVICE

BACKGROUND OF THE INVENTION

Field of the Invention

The present invention relates to a method for manufacturing a printed circuit board, a printed circuit board, and an electronic device.

Description of the Related Art

Digital cameras and smartphones with a camera are one example of electronic devices. The digital cameras and the smartphones include an image pickup device which includes a printed circuit board. The printed circuit board includes an electronic component such as an image sensor, and a printed wiring board on which the electronic component is mounted. As the image pickup device has been downsized and improved in performance, the electronic component has also been downsized and improved in performance. Thus, the electronic component used in the image pickup device has a package, such as a land grid array (LGA) package or a leadless chip carrier (LCC) package, which allows the electronic component to be downsized and to have many terminals. Since the lands of the package, which serve as terminals, are disposed on a main surface of the package and no lead terminals are formed on the package, the electronic component can be downsized. The lands of the package and lands of the printed wiring board are bonded with each other via bonding portions containing solder. However, the bonding portions may be broken depending on condition of use. For example, the impact caused when the image pickup device falls may break the bonding portions. In addition, since the improved performance of the electronic component increases the amount of heat generated when the electronic component operates, the amount of thermal expansion of the electronic component increases, increasing the amount of deformation of the electronic component. The increase in the amount of deformation may apply stress to the bonding portions, possibly breaking the bonding portions.

To prevent the bonding portions from being broken, there is a known technique to reinforce the bonding portions by using underfill such as resin. Japanese Patent Application Publication No. 2006-186011 describes a method in which an electronic component is mounted on a printed wiring board by using paste in which solder powder and thermosetting resin are mixed. In such type of paste, when the paste is heated to a temperature equal to or higher than a solder melting point, the solder is separated from the thermosetting resin which is uncured. The uncured thermosetting resin is separated from the solder, and moved to the periphery of the solder. Then, the resin is cured through curing reaction caused when the resin is heated. The cured resin covers the bonding portions to reinforce the bonding portions. Since the use of the paste eliminates a process to fill the bonding portions with the underfill material after solder bonding, the printed circuit board can be easily made.

When the electronic component is downsized, the pitch of the lands of the electronic component is reduced. Thus, the bonding portions are required to be smaller. However, in the case where the bonding portions are made small, when the paste containing the solder powder and the thermosetting resin is heated, the uncured thermosetting resin with fluidity may not stay around the bonding portions but flow from around the bonding portions. In particular, the uncured thermosetting resin may flow from around outermost bonding portions of the plurality of bonding portions. If the thermosetting resin flows from around the bonding portions, the thermosetting resin cannot sufficiently reinforce the bonding portions.

SUMMARY OF THE INVENTION

According to a first aspect of the present invention, a method for manufacturing a printed circuit board, the method includes preparing an electronic component and a printed wiring board, the electronic component including a first base and a plurality of first lands, the first base including a first main surface, the plurality of first lands being disposed around a first portion of the first main surface, the printed wiring board including a second base and a plurality of second lands, the second base including a second main surface, the plurality of second lands being disposed around a second portion of the second main surface, disposing paste on one or both of the first lands and the seconds lands, the paste containing solder powder and uncured thermosetting resin, disposing a member on one of the first portion and the second portion, the member having a property to repel the uncured thermosetting resin, placing the electronic component on the printed wiring board such that the paste is sandwiched between the first lands and the second lands, and heating the paste.

According to a second aspect of the present invention, a printed circuit board includes an electronic component including a first base and a plurality of first lands, the first base including a first main surface, the plurality of first lands being disposed around a first portion of the first main surface and spaced from each other, a printed wiring board including a second base and a plurality of second lands, the second base including a second main surface, the plurality of second lands being disposed around a second portion of the second main surface and spaced from each other, bonding portions configured to bond the first lands and the second lands, a resin portion configured to cover the bonding portions and including cured thermosetting resin, and a member having a property to repel uncured thermosetting resin and disposed on one of the first portion and the second portion.

Further features of the present invention will become apparent from the following description of exemplary embodiments with reference to the attached drawings.

DESCRIPTION OF THE EMBODIMENTS

First Embodiment

Figure 1:
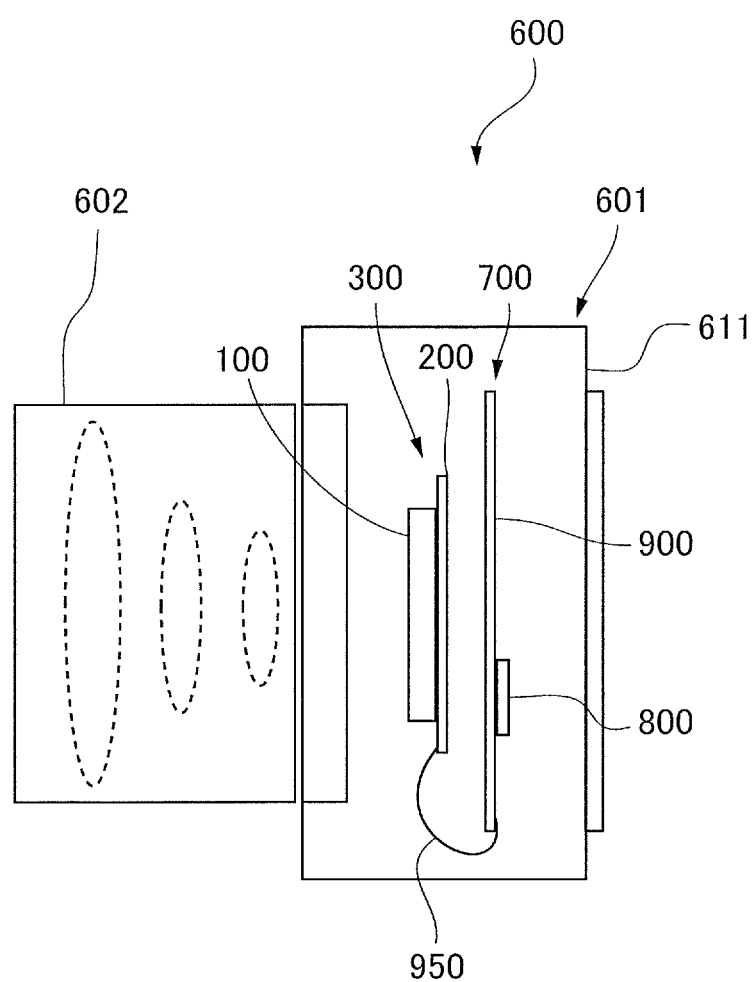
FIG. 1 is a diagram illustrating a digital camera which is one example of electronic devices of a first embodiment.

Hereinafter, some embodiments of the present invention will be described with reference to the accompanying drawings. FIG. 1 is a diagram illustrating a digital camera 600, which is an image pickup device as one example of electronic devices of a first embodiment. The digital camera 600, which is an image pickup device, is a digital camera with interchangeable lenses and includes a camera body 601. The camera body 601 is provided with a detachable lens unit 602 including lenses. The camera body 601 includes a housing 611, and printed circuit boards 300 and 700 disposed in the housing 611. The printed circuit boards 300 and 700 are electrically connected with each other via a cable 950.

The printed circuit board 300 includes an image sensor 100 which is one example of electronic components, and a printed wiring board 200 on which the image sensor 100 is mounted. The printed circuit board 700 includes an image processing device 800 which is one example of electronic components, and a printed wiring board 900 on which the image processing device 800 is mounted.

The image sensor 100 may be a complementary metal oxide semiconductor (CMOS) image sensor or a charge coupled device (CCD) image sensor. The image sensor 100 has a function that converts the light incident through the lens unit 602, to an electric signal.

The image processing device 800 may be a digital signal processor. The image processing device 800 has a function that receives the electric signal from the image sensor 100, corrects the electric signal, and creates image data from the corrected electric signal.

Figure 2:
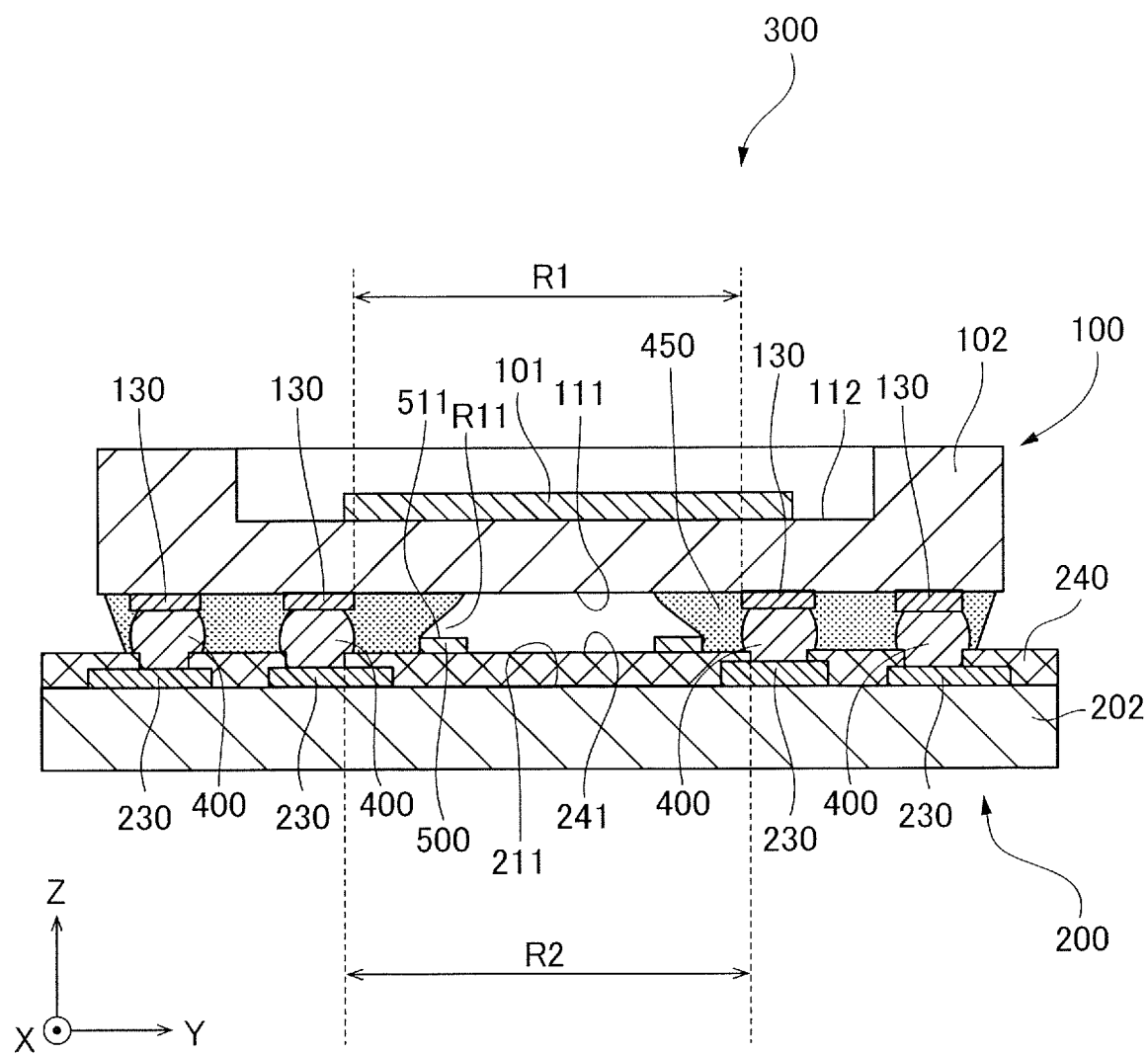
FIG. 2 is a cross-sectional view of a printed circuit board of the first embodiment.

FIG. 2 is a cross-sectional view of the printed circuit board 300 of the first embodiment. The image sensor 100 is an LGA package. Alternatively, the image sensor 100 may be an LCC package. The image sensor 100 includes a sensor element 101 which is a semiconductor element, an insulating substrate 102 which is a first base, and a plurality of lands 130 which are first lands. The lands 130 are disposed on a main surface 111 of the insulating substrate 102. The main surface 111 is a first main surface. The sensor element 101 is disposed on a surface 112 of the insulating substrate 102, opposite to the main surface 111. The lands 130 are electrodes made of electrically conductive metal, such as copper. For example, each of the lands 130 is a signal electrode, a power electrode, a ground electrode, or a dummy electrode. Here, an in-plane direction along the main surface 111 is defined as an XY-direction, and an out-of-plane direction perpendicular to the main surface 111 is defined as a Z-direction.

Figure 3A:
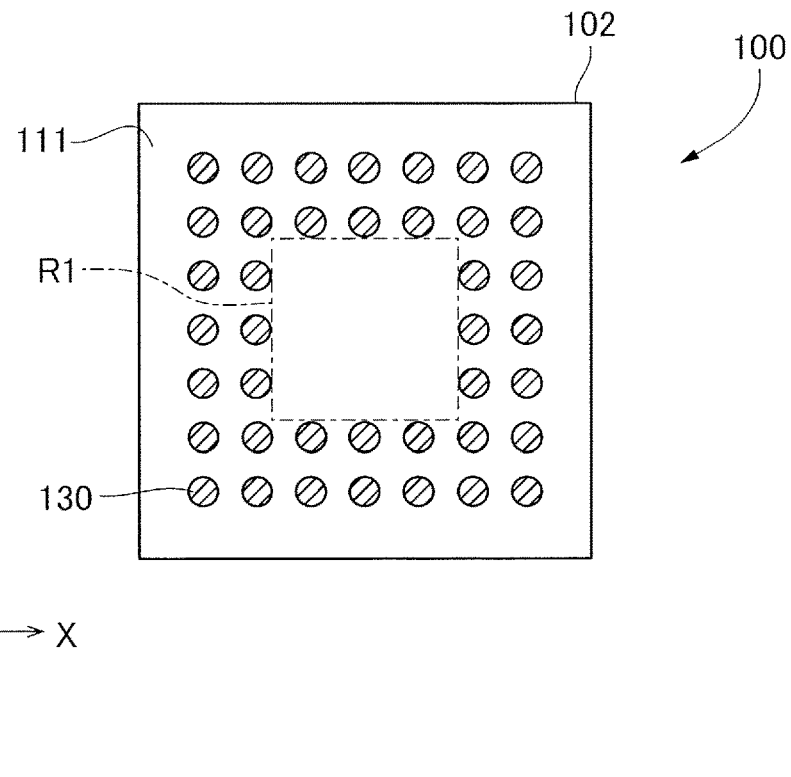
FIG. 3A is a plan view of an image sensor of the first embodiment, as viewed from a first main surface side of the image sensor.

FIG. 3A is a plan view of the image sensor 100, as viewed from the main surface 111 side. The lands 130 are circular in the plan view, but are not limited to this. For example, the lands 130 may be shaped like a polygon or a cross in the plan view. The insulating substrate 102 may be made of ceramic material.

As illustrated in FIG. 2, the printed wiring board 200 includes an insulating substrate 202 which is a second base, and a plurality of lands 230 which are second lands. The lands 230 are disposed on a main surface 211 of the insulating substrate 202. The main surface 211 is a second main surface. The lands 230 are electrodes made of electrically conductive metal, such as copper. For example, each of the lands 230 is a signal electrode, a power electrode, a ground electrode, or a dummy electrode. The insulating substrate 202 is made of insulating material, such as epoxy resin.

Figure 3B:
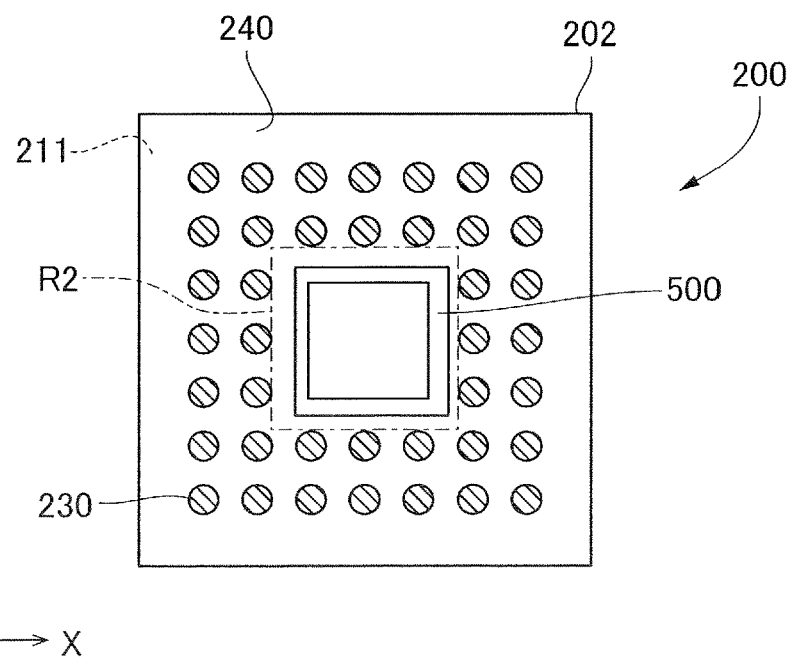
FIG. 3B is a plan view of a printed wiring board of the first embodiment, as viewed from a second main surface side of the printed wiring board.

The printed wiring board 200 includes a solder resist 240. The solder resist 240 is a film formed on the main surface 211. The lands 230 are solder mask defined (SMD) lands in the present embodiment, but are not limited to this. For example, the lands 230 may be non-solder mask defined (NSMD) lands. Alternatively, the solder resist 240 may not be formed on the printed wiring board 200. FIG. 3B is a plan view of the printed wiring board 200, as viewed from the main surface 211 side. The lands 230 are circular in the plan view, but are not limited to this. For example, the lands 230 may be shaped like a polygon or a cross in the plan view.

As illustrated in FIG. 2, the lands 130 and the lands 230 are bonded with each other via bonding portions 400 which contain solder. The bonding portions 400 are covered with a resin portion 450 which is an underfill. The resin portion 450 is made of thermally cured thermosetting resin. In the present embodiment, the plurality of bonding portions 400 are covered with the resin portion 450 formed as one body. Although the plurality of bonding portions 400 are preferably covered with the resin portion 450 formed as one body, the present disclosure is not limited to this. For example, the bonding portions 400 may be covered with a plurality of resin portions separated from each other.

As illustrated in FIG. 3A, the plurality of lands 130 are disposed, spaced from each other, around a portion R1 of the main surface 111. The portion R1 is a first portion, and includes a center of the main surface 111. As illustrated in FIG. 3B, the plurality of lands 230 are disposed, spaced from each other, around a portion R2 of the main surface 211. The portion R2 is a second portion. The lands 230 are disposed at positions corresponding to positions of the lands 130. The portion R1 and the portion R2 face each other. In the present embodiment, a member 500 having a property to repel uncured thermosetting resin is disposed on one of the portions R1 and R2, that is, on the portion R2. The member 500 may be disposed on both of the portions R1 and R2. As illustrated in FIG. 3B, the member 500 is shaped like a loop. The member 500 has a surface 511 facing the portion R1, which is the other portion. Above the surface 511 of the member 500, there is a space R11 where the resin portion 450 is not formed.

The member 500 may be disposed in contact with the portion R2 of the main surface 211. However, since the solder resist 240 is disposed on the main surface 211 in the present embodiment, the member 500 is disposed not in contact with the portion R2 of the main surface 211, but in contact with a surface 241 of the solder resist 240. That is, the member 500 is disposed on a portion of the solder resist 240 which is above the portion R2.

Next, a method for manufacturing the printed circuit board 300 will be described. FIGS. 4A, 4B, 4C, 5A, 5B, and 5C are diagrams illustrating processes to manufacture the printed circuit board 300 of FIG. 2.

Figure 4A:
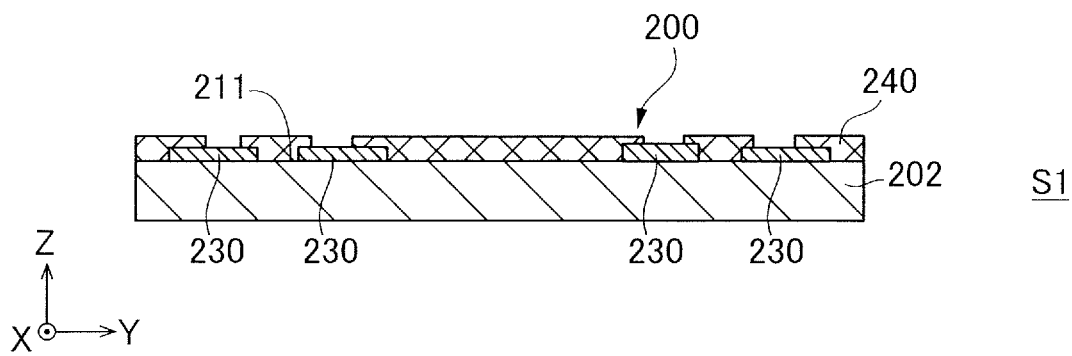
FIG. 4A is a diagram illustrating a method for manufacturing the printed circuit board of the first embodiment.
Figure 4B:
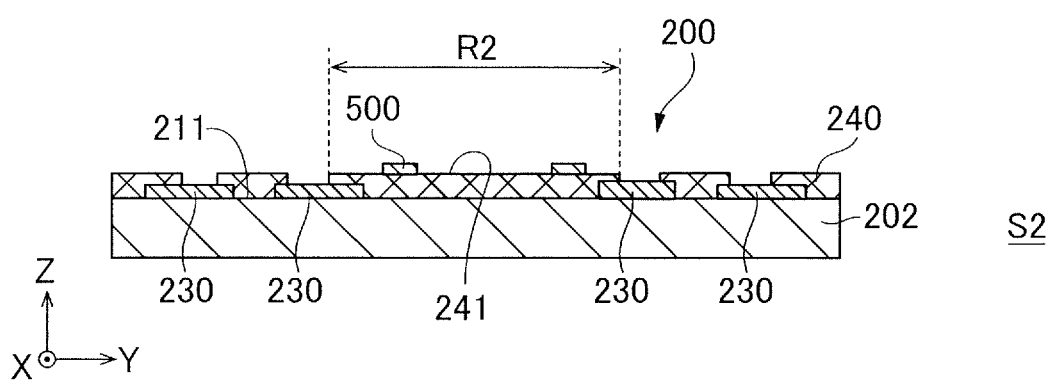
FIG. 4B is a diagram illustrating the method for manufacturing the printed circuit board of the first embodiment.
Figure 4C:
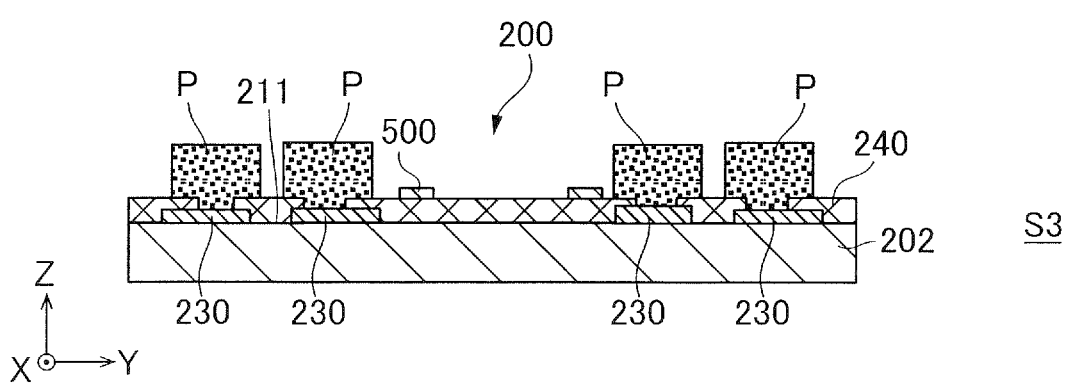
FIG. 4C is a diagram illustrating the method for manufacturing the printed circuit board of the first embodiment.

As illustrated in FIG. 4A, the printed wiring board 200 is prepared (Step S1). In Step S1, the image sensor 100 is also prepared. In the present embodiment, the member 500 having a property to repel uncured thermosetting resin is disposed on the portion R2, as illustrated in FIG. 4B (Step S2). The member 500 may be disposed on both of the portion R1 illustrated in FIG. 3A and the portion R2 illustrated in FIG. 3B. Then, a paste P is disposed on the land 230, as illustrated in FIG. 4C (Step S3). The paste P may be disposed on both of the land 130 illustrated in FIG. 3A and the land 230 illustrated in FIG. 3B. The thickness of the member 500, which is formed on the solder resist 240 and has a property to repel uncured thermosetting resin, may be equal to or smaller than the thickness of the paste P. Although Step S3 is performed after Step S2, Step S3 may be performed before Step S2. In another case, Step S2 and Step S3 may be performed simultaneously. That is, Step S2 and Step S3 have only to be performed before later-described Step S4.

The paste P contains solder powder and uncured thermosetting resin. The thermosetting resin is preferably thermosetting epoxy resin, and more preferably, bisphenol A epoxy resin. The paste P may further contain a flux component necessary for soldering. The member 500 may be made from any material as long as the material repels the uncured thermosetting resin. In the present embodiment, the member 500 contains silicone oil, as a main component. In the member 500, the silicone oil is contained in silicone adhesive or silicone rubber. Thus, the silicone oil is preferably a modified silicone oil, and more preferably, dimethyl silicone oil. In the present embodiment, the member 500, which contains the silicone oil, serves also as adhesive.

The uncured epoxy resin in a liquid state in the paste P has a large contact angle on a surface with a lower surface energy than that of the epoxy resin. Thus, the epoxy resin hardly gets wet with the surface, and is repelled by the surface. By utilizing such a phenomenon, the present embodiment controls fluidity of the uncured liquid epoxy resin, by disposing the member 500 which contains silicone oil, and by forming a portion having a lower surface energy than that of the solder resist 240. The area in which the member 500, which contains silicone oil, is disposed has a lower surface energy than that of the other area (i.e. surface 241 of the solder resist 240 in FIG. 4B) in which the member 500 is not disposed. Thus, the boundary between the area in which the member 500 is disposed and the area in which the member 500 is not disposed is a boundary between an area with a relatively low surface energy and an area with a relatively high surface energy. When the liquid epoxy resin flowing in an area with a relatively high surface energy, such as the area in which the member 500 is not disposed, reaches the boundary between the area with a relatively high surface energy and an area with a relatively low surface energy, the liquid epoxy resin is repelled by the member 500, and tends to form a round shape due to the surface tension of the liquid epoxy resin. As a result, the flow of the liquid epoxy resin is stopped at the boundary between the area in which the member 500 is not disposed and the area in which the member 500 is disposed. In this manner, the flow of the liquid epoxy resin can be controlled.

In the member 500, a crosslinker such as benzoyl peroxide may be added. The amount of the additive is preferably equal to or smaller than 1 weight percent of the amount of silicone adhesive or silicone rubber. The main component of the member 500 is preferably silicone oil, but may be a fluororesin which repels the epoxy resin.

In Step S2, a jig (not illustrated) or a stamp (not illustrated) such as a rubber stamp is used to dispose the member 500 on the insulating substrate 202, that is, on the solder resist 240. The method of disposing the member 500 is not limited to this. For example, the member 500 may be disposed on the printed wiring board 200 by using screen printing or a dispenser.

In Step S3, the paste P is supplied onto the printed wiring board 200 by using screen printing or a dispenser. The paste P may be supplied so as to cover all or part of each land 230.

Figure 5A:
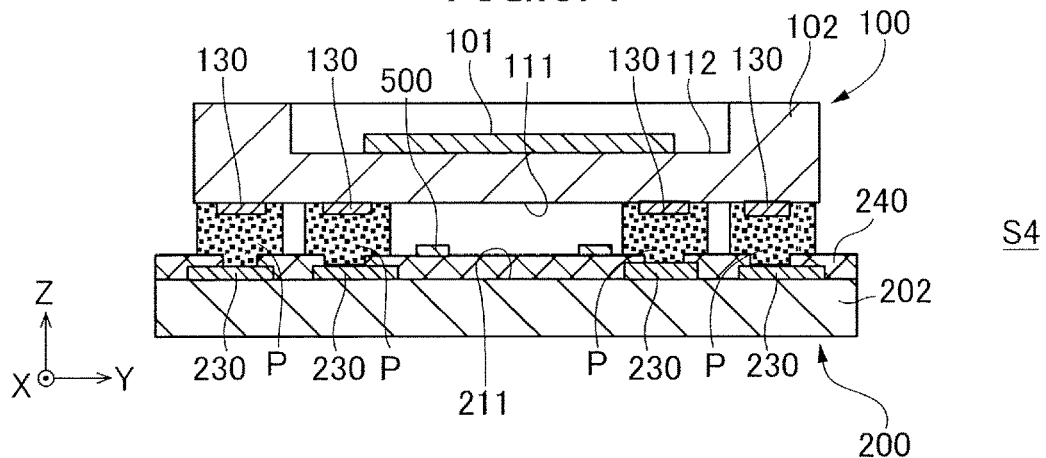
FIG. 5A is a diagram illustrating the method for manufacturing the printed circuit board of the first embodiment.

Then, as illustrated in FIG. 5A, the image sensor 100 is placed on the printed wiring board 200 such that the paste P is sandwiched between the lands 130 and the lands 230 (Step S4). In the present embodiment, in Step S4, the image sensor 100 is placed on the printed wiring board 200 by using a mounter (not illustrated). In this time, the image sensor 100 is first positioned at a position at which the lands 130 face the lands 230, and then the image sensor 100 is placed on the printed wiring board 200.

Figure 5B:
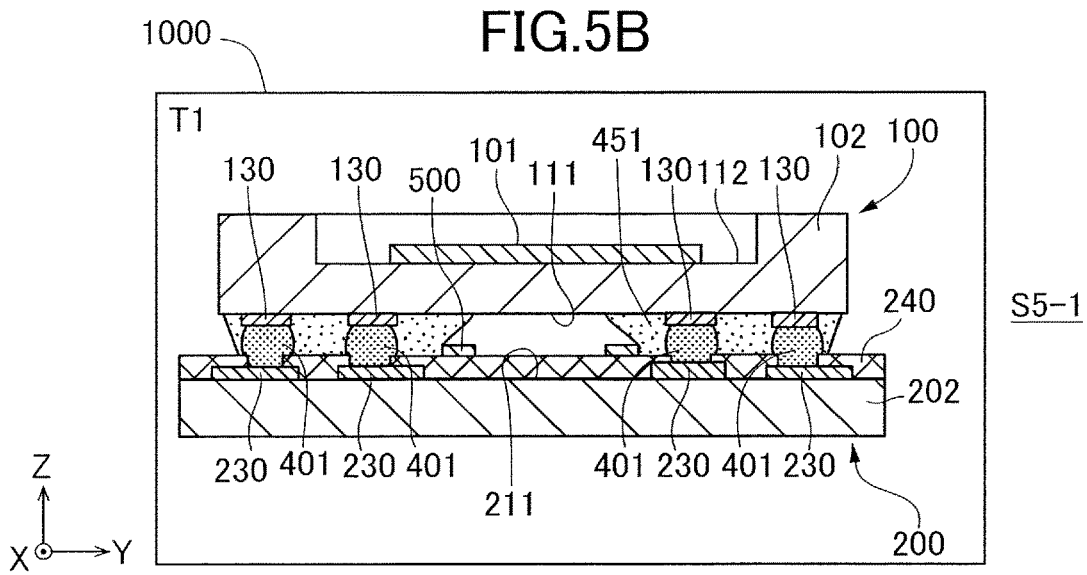
FIG. 5B is a diagram illustrating the method for manufacturing the printed circuit board of the first embodiment.

Then, as illustrated in FIG. 5B, the image sensor 100 and the printed wiring board 200 are conveyed into a reflow furnace 1000, in a state where the image sensor 100 is placed on the printed wiring board 200. In Step S5-1 illustrated in FIG. 5B and Step S5-2 illustrated in FIG. 5C, the image sensor 100 and the printed wiring board 200 are bonded with each other with solder, by heating the paste P while adjusting the heating temperature of the reflow furnace 1000.

First, Step S5-1 illustrated in FIG. 5B will be described. In Step S5-1, the temperature of the reflow furnace 1000 is adjusted to a first temperature T1 equal to or higher than a melting temperature of the solder powder of the paste P. With this operation, the solder powder of the paste P is melted, and the paste P is separated into a molten solder 401 and an uncured thermosetting resin 451. Specifically, the thermosetting resin 451 moves to the periphery of the molten solder 401. The first temperature T1 is preferably constant over time, but may fluctuate.

Figure 5C:
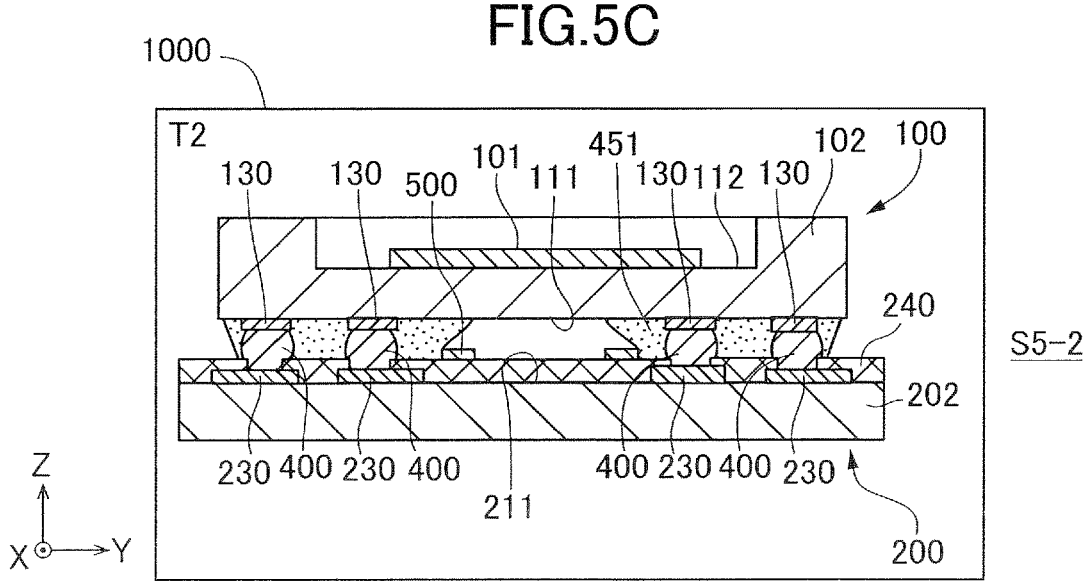
FIG. 5C is a diagram illustrating the method for manufacturing the printed circuit board of the first embodiment.

In Step S5-2 illustrated in FIG. 5C, the molten solder 401 is solidified by adjusting the temperature of the reflow furnace 1000 to a second temperature T2 lower than the solder melting point (T2<T1). With this operation, the bonding portions 400 to bond the lands 130 and the lands 230 are formed.

The second temperature T2 is a temperature at which the thermosetting resin 451 is also solidified. The temperature of the reflow furnace 1000 is kept at the second temperature T2 for a period of time equal to or longer than a period of time necessary to cure the thermosetting resin 451. With this operation, the thermosetting resin 451 is gradually cured, and the resin portion 450 illustrated in FIG. 2 is formed. The second temperature T2 is preferably constant over time, but may fluctuate.

The resin portion 450 illustrated in FIG. 2 reinforces the bonding portions 400. More specifically, the resin portion 450 reinforces contact portions between the bonding portions 400 and the lands 130, and contact portions between the bonding portions 400 and the lands 230, thus increasing reliability of bonding of the bonding portions 400.

Here, although the description has been made for the case where Step S5-1 illustrated in FIG. 5B and Step S5-2 illustrated in FIG. 5C are successively performed in the identical reflow furnace 1000, the process is not limited to this. If the reflow furnace 1000 is small in size, and a sufficient period of time for Step S5-2 cannot be ensured, the image sensor 100 and the printed wiring board 200 may be first heated in the reflow furnace 1000 in Step S5-1, then an intermediate product may be moved to another heating furnace (not illustrated), and then the thermosetting resin 451 may be heated at the second temperature T2, to be cured.

In Step S5-1, the paste P is separated into the molten solder 401 in which the solder aggregates, and the uncured thermosetting resin 451 which has moved to the periphery of the molten solder 401. In this time, the uncured thermosetting resin 451 has a smaller surface area than that of the paste, and the apparent viscosity of the uncured thermosetting resin 451 decreases, increasing the fluidity of the uncured thermosetting resin 451. The thermosetting resin 451 with the increased fluidity tends to flow into a small space due to capillary phenomenon.

On the other hand, one or both of the main surface 111 of the image sensor 100 and the main surface 211 of the printed wiring board 200 do not become geometric planes after they are heated at the first temperature T1. That is, one or both of the image sensor 100 and the printed wiring board 200 are warped by the heating. The warpage may cause a gap between the image sensor 100 and the printed wiring board 200 at a center portion of the image sensor 100, to be smaller than a gap between the image sensor 100 and the printed wiring board 200 at an outer peripheral portion of the image sensor 100. Since the center portion of the image sensor 100 has no lands, the paste P is not supplied onto the center portion. In addition, since the downsized image sensor 100 causes the pitch of the lands 130 to be smaller, the bonding portions 400 are also made smaller, reducing the gap between the image sensor 100 and the printed wiring board 200. Consequently, this structure easily causes capillary phenomenon. Due to the capillary phenomenon, the thermosetting resin 451 tends to flow to the center portion of the image sensor 100.

Here, even if a projection made of the solder resist is formed on the printed wiring board at a position facing the center portion of the image sensor, the resin with fluidity will flow along the projection and move to the center portion due to the capillary phenomenon.

As countermeasures to this, in the present embodiment, the member 500 having a property to repel the uncured thermosetting resin 451 is disposed on the portion R2, which faces the portion R1 located in the center of the image sensor 100. The member 500 prevents the thermosetting resin 451 from flowing over the member 500. That is, even though the capillary phenomenon induces the thermosetting resin 451 to flow toward the center portion of the image sensor 100, the member 500 repels the thermosetting resin 451 and prevents the thermosetting resin 451 from flowing inward of the member 500.

Figure 6A:
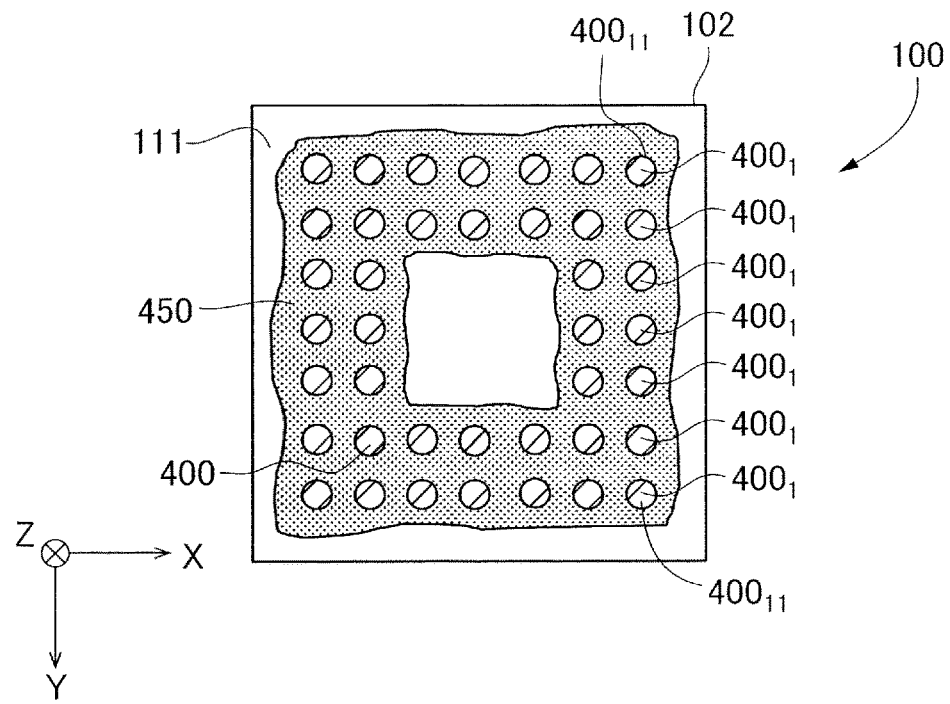
FIG. 6A is a schematic diagram of the image sensor, obtained by cutting bonding portions and a resin portion of the printed circuit board of the first embodiment.
Figure 6B:
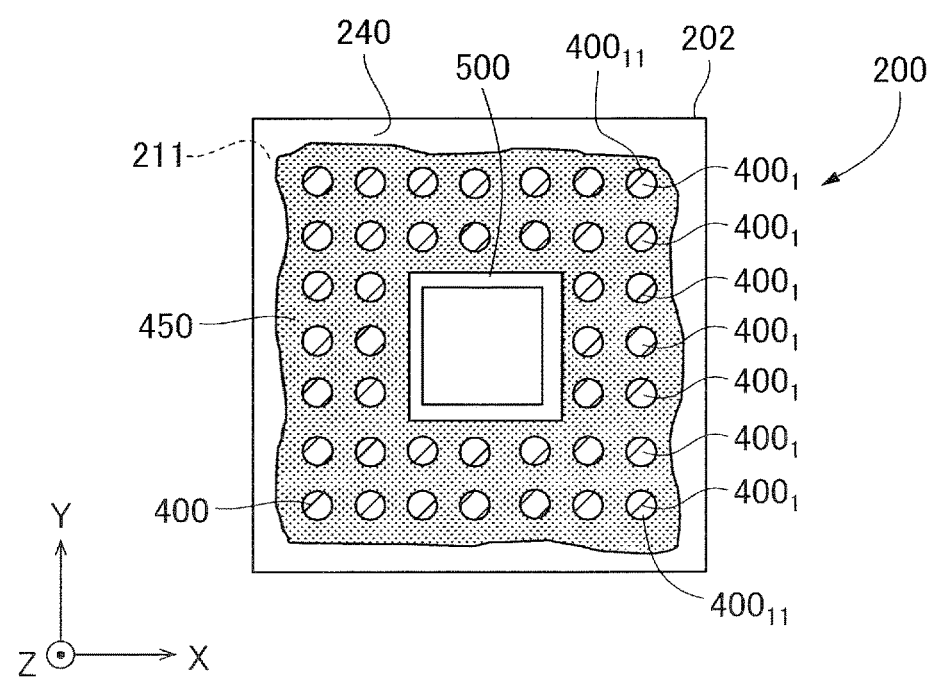
FIG. 6B is a schematic diagram of the printed wiring board, obtained by cutting the bonding portions and the resin portion of the printed circuit board of the first embodiment.

FIG. 6A is a schematic diagram of the image sensor 100, obtained by cutting the bonding portions 400 and the resin portion 450 of the printed circuit board 300 of FIG. 2, along the XY-direction which is an in-plane direction. FIG. 6B is a schematic diagram of the printed wiring board 200, obtained by cutting the bonding portions 400 and the resin portion 450 of the printed circuit board 300 of FIG. 2, along the XY-direction which is an in-plane direction.

As illustrated in FIGS. 6A and 6B, the resin portion 450 is formed, indicating that the thermosetting resin 451 was prevented from flowing to the center portion of the image sensor 100 and cured. In this formation, the amount of resin of the resin portion 450 does not become insufficient in the periphery of each of the bonding portions 400, in particular, in the periphery of each of outermost bonding portions $400_1$ of the plurality of bonding portions 400. That is, since the thermosetting resin 451 can be prevented from flowing to the center portion of the image sensor 100 in which no bonding portions are formed, more resin can be left in the periphery of each of the bonding portions 400, in particular, in the periphery of each of the outermost bonding portions $400_1$. In addition, more resin can be left also in the periphery of each of corner bonding portions $400_{11}$ of the outermost bonding portions $400_1$.

When the environment around the digital camera 600 such as the temperature around the digital camera 600 changes, stress will be applied to the bonding portions 400 due to the difference in linear-expansion coefficient between the image sensor 100 and the printed wiring board 200. In addition, when the digital camera 600 falls, force of impact will be applied to the bonding portions 400. In the present embodiment, however, since the bonding portions 400 are reinforced by the resin portion 450, the bonding portions 400 can be prevented from being broken even when the stress, caused when the temperature changes, or the force of impact, caused when the digital camera 600 falls, is applied. Thus, the reliability of bonding of the bonding portions 400 is improved. Here, the break of the bonding portions 400 means that the bonding portions 400 themselves are broken, that the bonding portions 400 are peeled off from the lands 130, or that the bonding portions 400 are peeled off from the lands 230. Since the reliability of bonding of each of the bonding portions 400 is increased, the electrical and mechanical connection is kept for a long time. Therefore, the life of the printed circuit board 300, that is, the life of the digital camera 600 can be extended.

In addition, since the printed circuit board 300 is made by using the paste P that contains the thermosetting resin, the solder bonding and the underfill formation can be simultaneously performed in the heating process (S5-1, S5-2) alone. Therefore, the printed circuit board 300 can be easily made.

Second Embodiment

Figure 7:
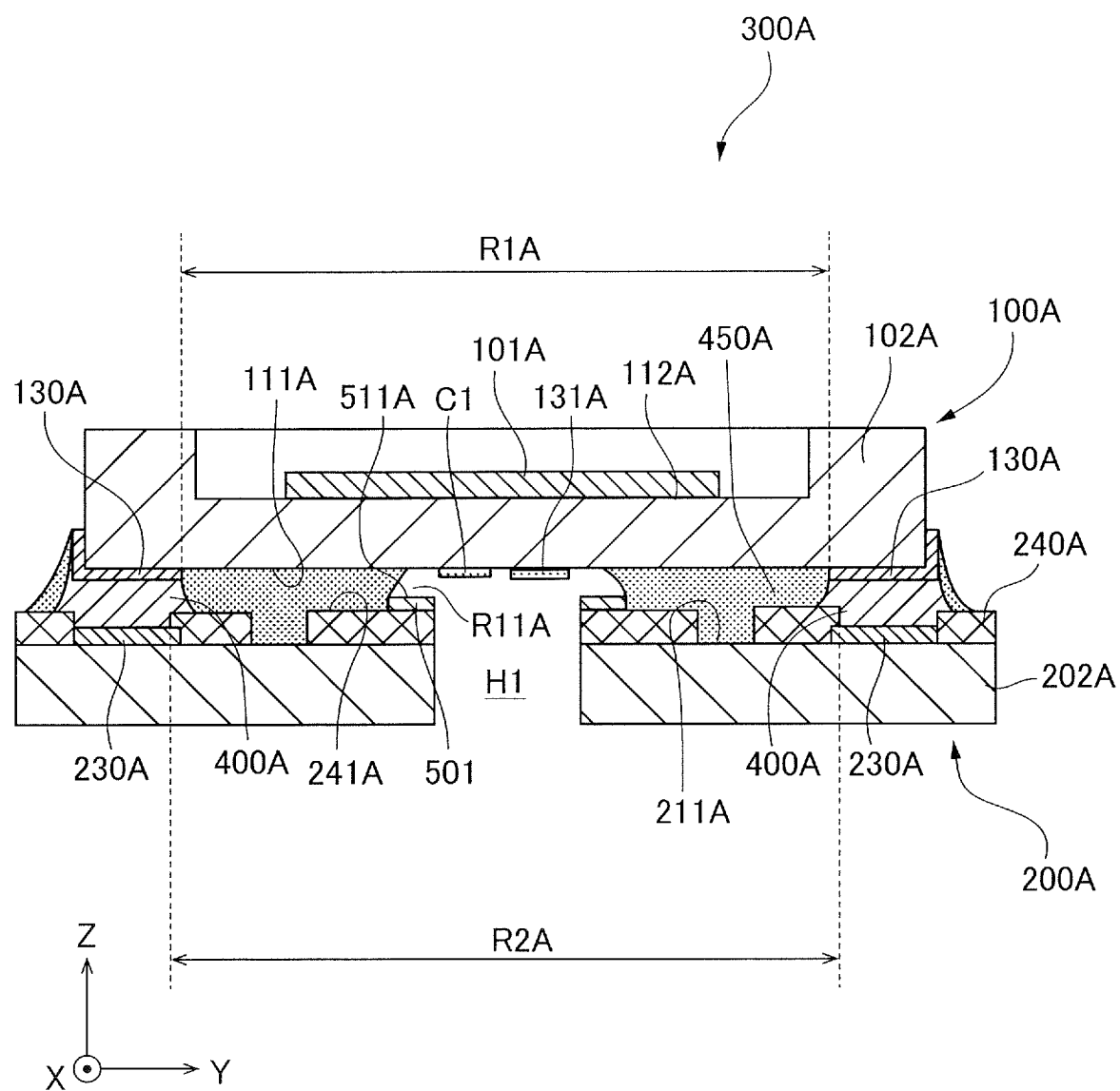
FIG. 7 is a cross-sectional view of a printed circuit board of a second embodiment.

Next, a printed circuit board of an image pickup device of a second embodiment will be described. FIG. 7 is a cross-sectional view of a printed circuit board 300A of the second embodiment. The image pickup device of the second embodiment includes the printed circuit board 300A, instead of the printed circuit board 300 of FIG. 1. The printed circuit board 300A includes an image sensor 100A which is one example of electronic components, and a printed wiring board 200A on which the image sensor 100A is mounted. The image sensor 100A may be a CMOS image sensor or a CCD image sensor. The image sensor 100A is an LCC package. Alternatively, the image sensor 100A may be an LGA package. The image sensor 100A includes a sensor element 101A which is a semiconductor element, an insulating substrate 102A which is a first base, and a plurality of lands 130A which are first lands. The lands 130A are disposed on a main surface 111A of the insulating substrate 102A. The main surface 111A is a first main surface. The sensor element 101A is disposed on a surface 112A of the insulating substrate 102A, opposite to the main surface 111A. The lands 130A are electrodes made of electrically conductive metal, such as copper. For example, each of the lands 130A is a signal electrode, a power electrode, a ground electrode, or a dummy electrode.

Figure 8A:
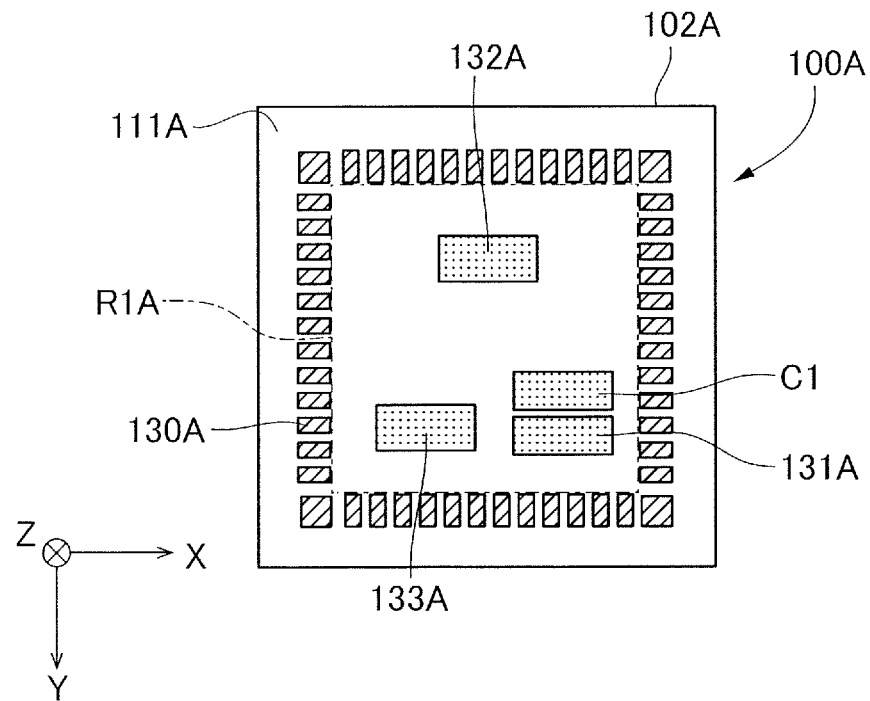
FIG. 8A is a plan view of an image sensor of the second embodiment, as viewed from a first main surface side of the image sensor.

FIG. 8A is a plan view of the image sensor 100A, as viewed from the main surface 111A side. The lands 130A are shaped like a rectangle, as one example of polygon, in the plan view; but are not limited to this. The lands 130A may be shaped like a circle or a cross in the plan view. The insulating substrate 102A may be made of ceramic material.

As illustrated in FIG. 7, the printed wiring board 200A includes an insulating substrate 202A which is a second base, and a plurality of lands 230A which are second lands. The lands 230A are disposed on a main surface 211A of the insulating substrate 202A. The main surface 211A is a second main surface. The lands 230A are electrodes made of electrically conductive metal, such as copper. For example, each of the lands 230A is a signal electrode, a power electrode, a ground electrode, or a dummy electrode. The insulating substrate 202A is made of insulating material, such as epoxy resin.

Figure 8B:
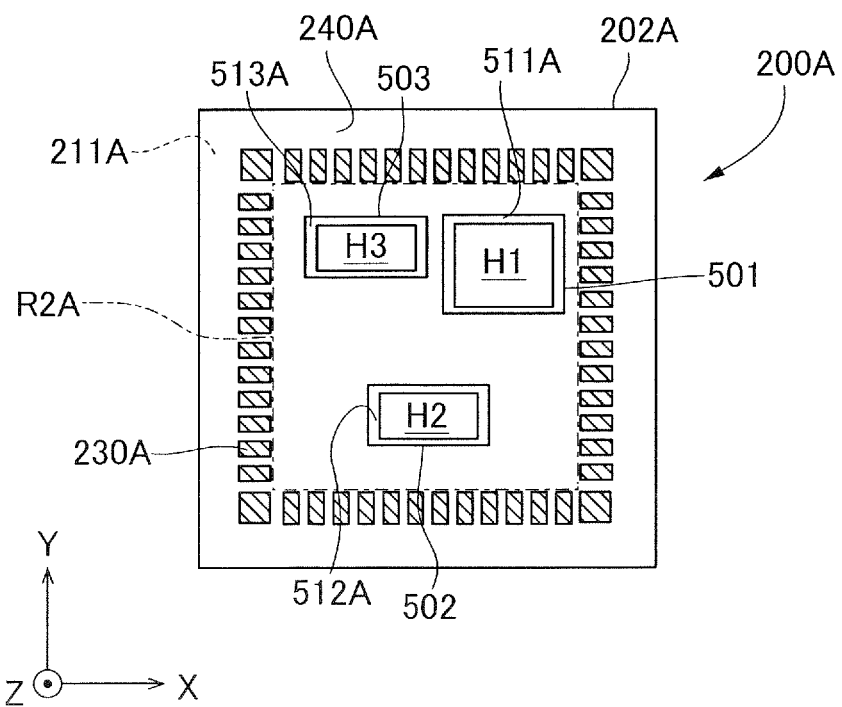
FIG. 8B is a plan view of a printed wiring board of the second embodiment, as viewed from a second main surface side of the printed wiring board.

The printed wiring board 200A includes a solder resist 240A. The solder resist 240A is a film formed on the main surface 211A. The lands 230A are SMD lands in the present embodiment, but are not limited to those. The lands 230A may be NSMD lands. Alternatively, the solder resist 240A may not be formed on the printed wiring board 200A. FIG. 8B is a plan view of the printed wiring board 200A, as viewed from the main surface 211A side. The lands 230A are shaped like a rectangle, as one example of polygon, in the plan view; but are not limited to this. The lands 230A may be shaped like a circle or a cross in the plan view.

As illustrated in FIG. 7, the lands 130A and the lands 230A are bonded with each other via bonding portions 400A which contain solder. The bonding portions 400A are covered with a resin portion 450A which is an underfill. The resin portion 450A is made of thermally cured resin. In the present embodiment, the plurality of bonding portions 400A are covered with the resin portion 450A formed as one body. The plurality of bonding portions 400A are preferably covered with the resin portion 450A formed as one body, but are not limited to this. For example, the bonding portions 400A may be covered with a plurality of resin portions separated from each other.

As illustrated in FIG. 8A, the plurality of lands 130A are disposed, spaced from each other, around a portion R1A of the main surface 111A. The portion R1A is a first portion, and includes a center of the main surface 111A. As illustrated in FIG. 8B, the plurality of lands 230A are disposed, spaced from each other, around a portion R2A of the main surface 211A. The portion R2A is a second portion. The lands 230A are disposed at positions corresponding to positions of the lands 130A. The portion R1A and the portion R2A face each other.

As illustrated in FIG. 8A, in the present embodiment, the portion R1A includes a portion C1 in which an image is formed. The image formed in the portion C1 is, for example, a DataMtrix code, a QR code (registered trademark), a bar code, a character, a numeric character, a mark, or a combination thereof. The image formed in the portion C1 is used to check the specifications or the like of the image sensor 100 when the camera is manufactured or repaired.

In the portion R1A, lands 131A, 132A, and 133A are formed. The lands 131A, 132A, and 133A are ground terminals which are to be fixed, via solder, to metal plates (not illustrated) of the camera body 601 of FIG. 1. The land 131A is disposed adjacent to the portion C1 in which the image is formed. By fixing the lands 131A, 132A, and 133A to the metal plate (not illustrated) via solder, the image sensor 100A can be positioned in the camera body 601.

In the insulating substrate 202A, an opening H1 which faces the portion C1 is defined by the portion R2A. Specifically, in the insulating substrate 202A, the opening H1 which faces the portion C1 is defined by one portion of the portion R2A. The opening H1 is disposed at a position which faces the portion C1 and the land 131A. In addition, in the insulating substrate 202A, an opening H2 which faces the land 132A is defined by the portion R2A, and an opening H3 which faces the land 133A is defined by the portion R2A. Thus, the image of the portion C1 can be checked with a scanner or a microscope (both not illustrated) through the opening H1, without removing the image sensor 100A from the printed wiring board 200A. The lands 131A, 132A, and 133A can be respectively bonded, via solder, with the metal plates (not illustrated) through the openings H1, H2, and H3.

In the present embodiment, members 501, 502, and 503 having a property to repel uncured thermosetting resin are disposed on one of the portions R1A and R2A, that is, on the portion R2A. The members 501, 502, and 503 may be disposed on both of the portions R1A and R2A. Components of the members 501, 502, and 503 are the same as those of the member 500 of the first embodiment. As illustrated in FIG. 8B, the members 501, 502, and 503 are respectively disposed around the openings H1, H2, and H3. The members 501, 502, and 503 are respectively formed like a loop so as to surround the openings H1, H2, and H3. The members 501, 502, and 503 respectively have surfaces 511A, 512A, and 513A which face the portion R1A. The portion R1A is the other portion. As illustrated in FIG. 7, above the surface 511A of the member 501, there is a space R11A in which the resin portion 450A is not formed. Although not illustrated in FIG. 7, above the surface 512A of the member 502 and the surface 513A of the member 503, there are also spaces in which the resin portion 450A is not formed.

The members 501 to 503 may be disposed in contact with the portion R2A of the main surface 211A. However, since the solder resist 240A is disposed on the main surface 211A in the present embodiment, the members 501 to 503 are disposed not in contact with the portion R2A of the main surface 211A, but in contact with a surface 241A of the solder resist 240A. That is, the members 501 to 503 are disposed on a portion of the solder resist 240A which is above the portion R2A.

Next, a method for manufacturing the printed circuit board 300A will be described. FIGS. 9A, 9B, 9C, 10A, 10B, and 10C are diagrams illustrating processes to make the printed circuit board 300A of FIG. 7.

Figure 9A:
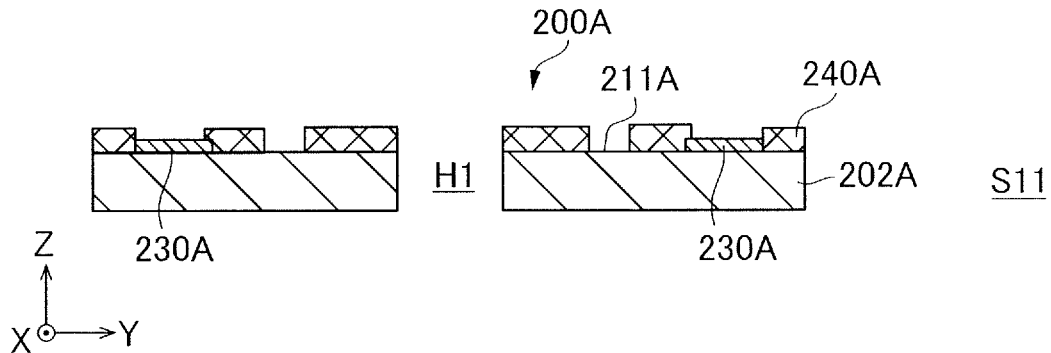
FIG. 9A is a diagram illustrating a method for manufacturing the printed circuit board of the second embodiment.
Figure 9B:
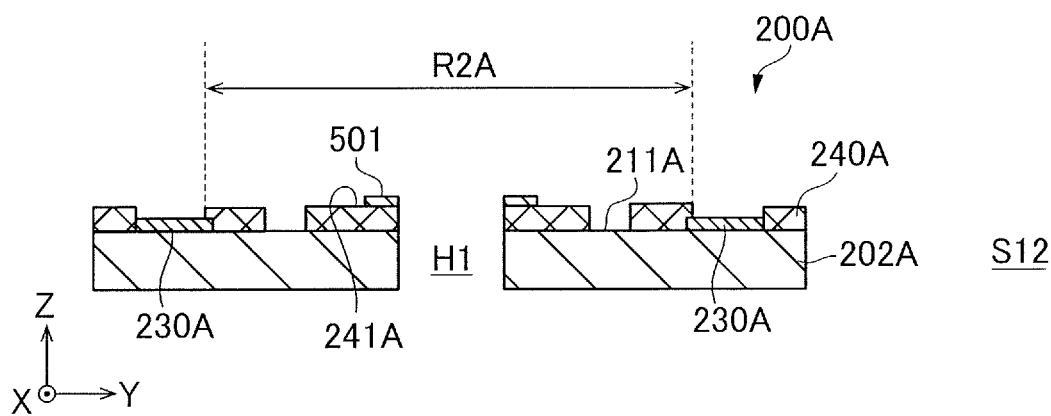
FIG. 9B is a diagram illustrating the method for manufacturing the printed circuit board of the second embodiment.
Figure 9C:
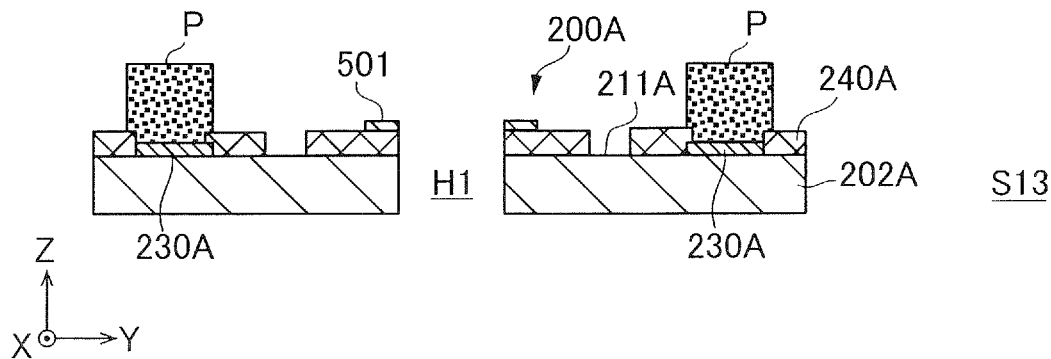
FIG. 9C is a diagram illustrating the method for manufacturing the printed circuit board of the second embodiment.

As illustrated in FIG. 9A, the printed wiring board 200A is prepared (Step S11). In Step S11, the image sensor 100A is also prepared. Then, the member 501 having a property to repel uncured thermosetting resin is disposed on one of the portion R1A illustrated in FIG. 8A and the portion R2A illustrated in FIG. 8B, that is, on the portion R2A, as illustrated in FIG. 9B (Step S12). The member 501 may be disposed on both of the portions R1A and R2A. Although not illustrated, the members 502 and 503 of FIG. 8B are also disposed on the portion R2A in Step S12, in the same manner as that for the member 501. Then, a paste P is disposed on one of the land 130A illustrated in FIG. 8A and the land 230A illustrated in FIG. 8B, that is, on the land 230A, as illustrated in FIG. 9C (Step S13). The paste P may be disposed on both of the lands 130A and 230A. The thickness of the members 501, 502, and 503, which are formed on the solder resist 240A and have a property to repel uncured thermosetting resin, may be equal to or smaller than the thickness of the paste P. Although Step S13 is performed after Step S12, Step S13 may be performed before Step S12. In another case, Step S12 and Step S13 may be performed simultaneously. That is, Step S12 and Step S13 have only to be performed before later-described Step S14.

In Step S12, a jig (not illustrated) or a stamp (not illustrated) such as a rubber stamp is used to dispose the members 501, 502, and 503 on the insulating substrate 202A, that is, on the solder resist 240A. The method of disposing the members 501, 502, and 503 is not limited to this. For example, the members 501, 502, and 503 may be disposed on the printed wiring board 200A by using screen printing or a dispenser. Here, in the insulating substrate 202A, the opening H1 is defined by the portion R2A so as to face the land 131A and the portion C1 in which the image is formed, the opening H2 is defined so as to face the land 132A, and the opening H3 is defined so as to face the land 133A. Thus, in Step S12, the member 501 is disposed, on the portion R2A, around the opening H1; the member 502 is disposed, on the portion R2A, around the opening H2; and the member 503 is disposed, on the portion R2A, around the opening H3.

In Step S13, the paste P is supplied onto the printed wiring board 200A by using screen printing or a dispenser. The paste P may be supplied so as to cover all or part of each land 230A.

Figure 10A:
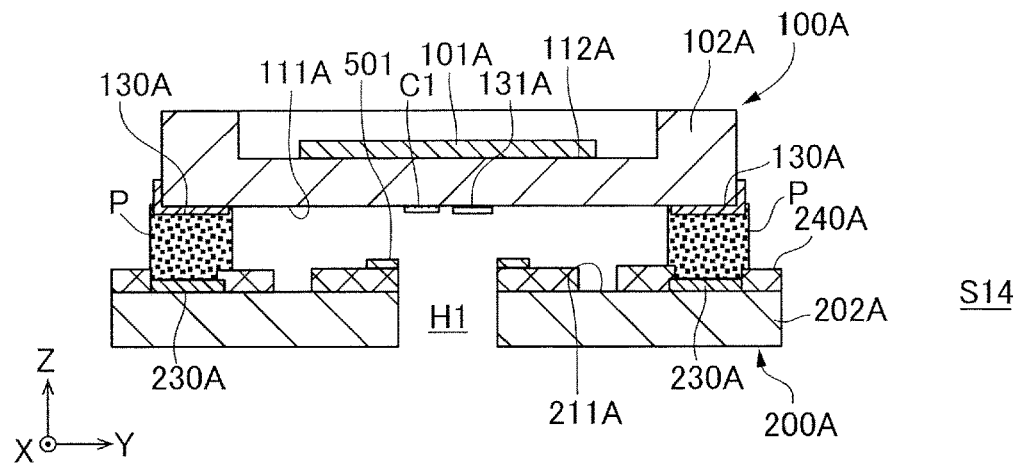
FIG. 10A is a diagram illustrating the method for manufacturing the printed circuit board of the second embodiment.

Then, as illustrated in FIG. 10A, the image sensor 100A is placed on the printed wiring board 200A such that the paste P is sandwiched between the lands 130A and the lands 230A (Step S14). In the present embodiment, in Step S14, the image sensor 100A is placed on the printed wiring board 200A by using a mounter (not illustrated). In this time, the image sensor 100A is first positioned at a position at which the lands 130A face the lands 230A, and then the image sensor 100A is placed on the printed wiring board 200A.

Figure 10B:
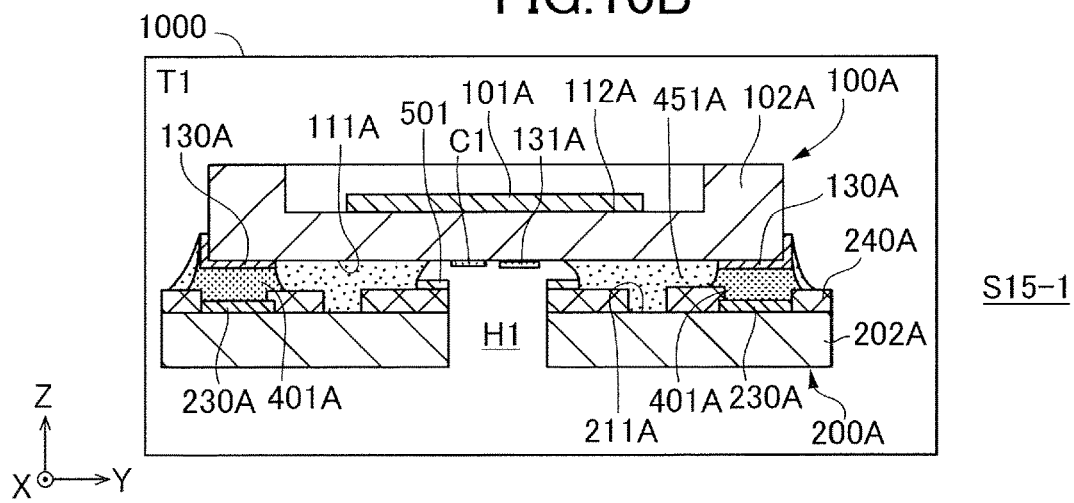
FIG. 10B is a diagram illustrating the method for manufacturing the printed circuit board of the second embodiment.

Then, as illustrated in FIG. 10B, the image sensor 100A and the printed wiring board 200A are conveyed into a reflow furnace 1000, in a state where the image sensor 100A is placed on the printed wiring board 200A. In Step S15-1 illustrated in FIG. 10B and Step S15-2 illustrated in FIG. 10C, the image sensor 100A and the printed wiring board 200A are bonded with each other with solder, by heating the paste P while adjusting the heating temperature of the reflow furnace 1000.

In Step S15-1 illustrated in FIG. 10B, the temperature of the reflow furnace 1000 is adjusted to a first temperature T1 equal to or higher than a melting temperature of the solder powder of the paste P. With this operation, the solder powder of the paste P is melted, and the paste P is separated into a molten solder 401A and an uncured thermosetting resin 451A. Specifically, the thermosetting resin 451A moves to the periphery of the molten solder 401A. The first temperature T1 is preferably constant over time, but may fluctuate.

Figure 10C:
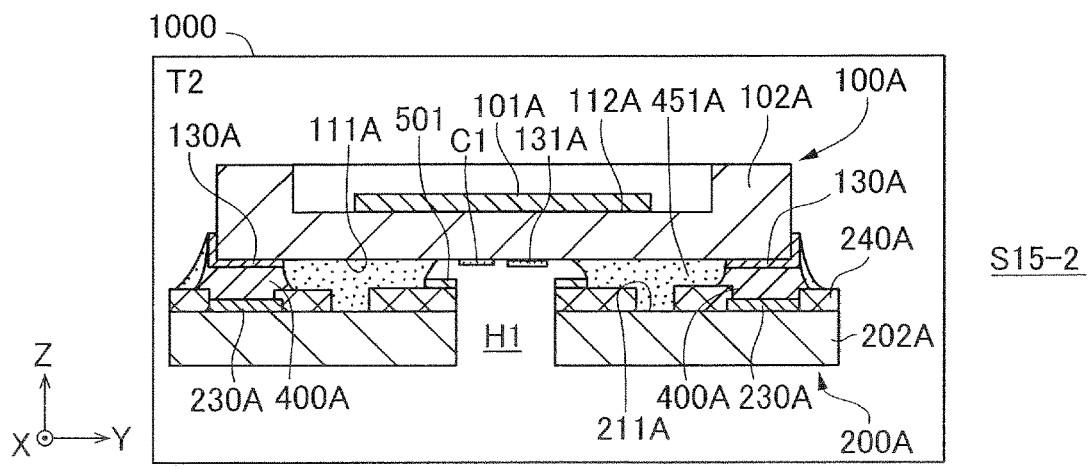
FIG. 10C is a diagram illustrating the method for manufacturing the printed circuit board of the second embodiment.

In Step S15-2 illustrated in FIG. 10C, the molten solder 401A is solidified by adjusting the temperature of the reflow furnace 1000 to a second temperature T2 lower than the solder melting point (T2<T1). With this operation, the bonding portions 400A to bond the lands 130A and the lands 230A are formed.

The second temperature T2 is a temperature at which the thermosetting resin 451A is also solidified. The temperature of the interior of the reflow furnace 1000 is kept at the second temperature T2 for a period of time equal to or longer than a period of time necessary to cure the thermosetting resin 451A. With this operation, the thermosetting resin 451A is gradually cured, and the resin portion 450A illustrated in FIG. 7 is formed. The second temperature T2 is preferably constant over time, but may fluctuate.

The resin portion 450A illustrated in FIG. 7 reinforces the bonding portions 400A. More specifically, the resin portion 450A reinforces contact portions between the bonding portions 400A and the lands 130A, and contact portions between the bonding portions 400A and the lands 230A, thus increasing reliability of bonding of the bonding portions 400A.

In the present embodiment, the members 501, 502, and 503 having a property to repel the uncured thermosetting resin 451A are respectively formed around the openings H1, H2, and H3. The members 501, 502, and 503 prevent the thermosetting resin 451A from flowing over the members 501, 502, and 503.

Figure 11A:
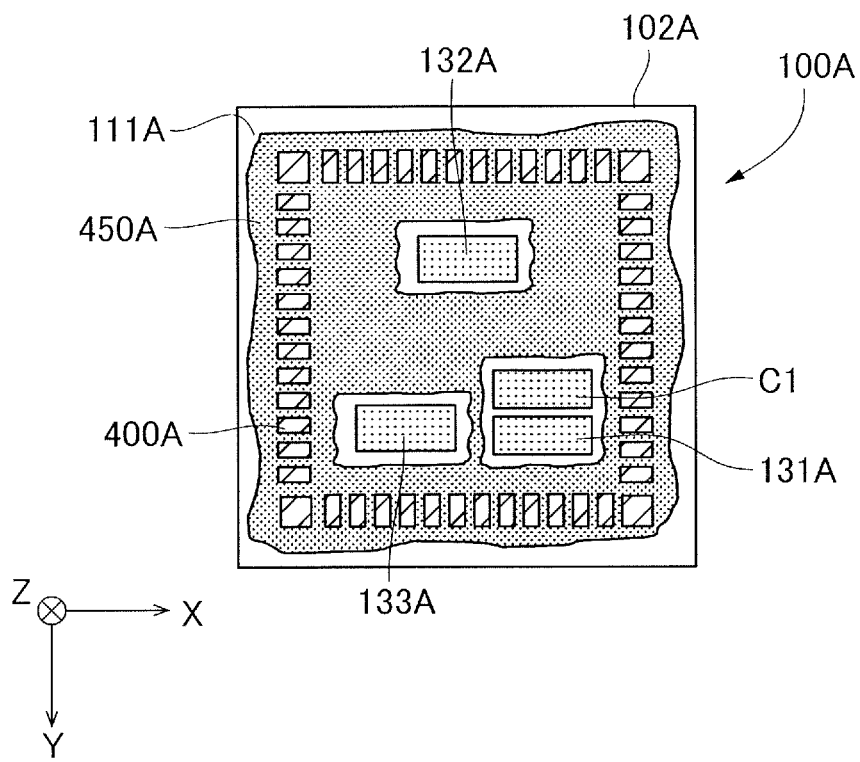
FIG. 11A is a schematic diagram of the image sensor, obtained by cutting bonding portions and a resin portion of the printed circuit board of the second embodiment.
Figure 11B:
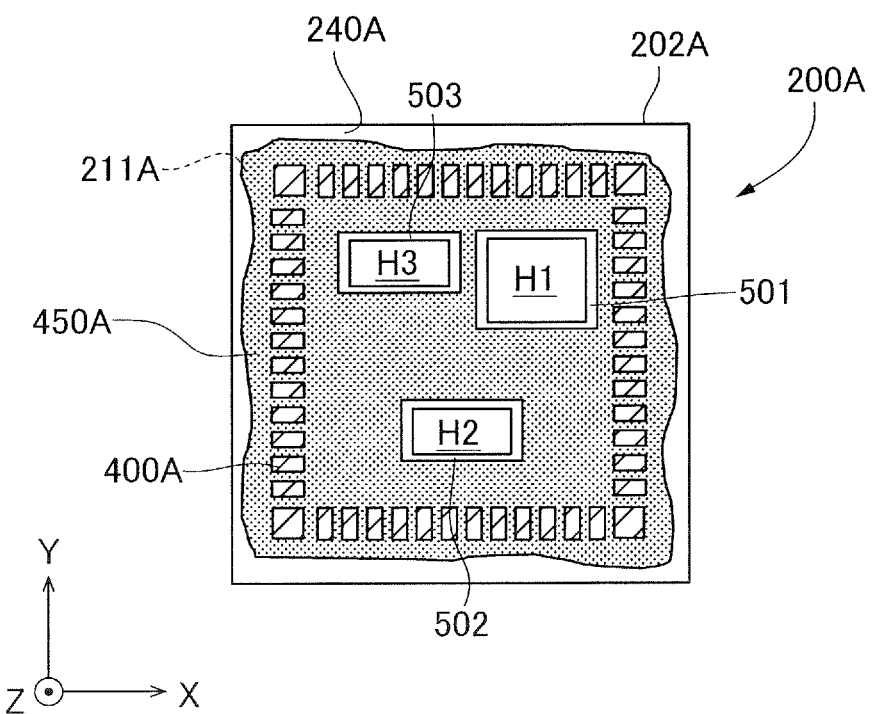
FIG. 11B is a schematic diagram of the printed wiring board, obtained by cutting the bonding portions and the resin portion of the printed circuit board of the second embodiment.

FIG. 11A is a schematic diagram of the image sensor 100A, obtained by cutting the bonding portions 400A and the resin portion 450A of the printed circuit board 300A of FIG. 7, along the XY-direction which is an in-plane direction. FIG. 11B is a schematic diagram of the printed wiring board 200A, obtained by cutting the bonding portions 400A and the resin portion 450A of the printed circuit board 300A of FIG. 7, along the XY-direction which is an in-plane direction.

As illustrated in FIGS. 11A and 11B, the resin portion 450A is formed, indicating that the thermosetting resin 451A was prevented from flowing over the members 501, 502, and 503 and cured. In this formation, the amount of resin of the resin portion 450A does not become insufficient in the periphery of each of the bonding portions 400A.

When the environment around the digital camera such as the temperature around the digital camera changes, stress will be applied to the bonding portions 400A due to the difference in linear-expansion coefficient between the image sensor 100A and the printed wiring board 200A. In addition, when the digital camera falls, force of impact will be applied to the bonding portions 400A. In the present embodiment, however, since the bonding portions 400A are reinforced by the resin portion 450A, the bonding portions 400A can be prevented from being broken even when the stress, caused when the temperature changes, or the force of impact, caused when the digital camera falls, is applied. Thus, the reliability of bonding of the bonding portions 400A is improved. Since the reliability of bonding of each of the bonding portions 400A is increased, the electrical and mechanical connection is kept for a long time. Therefore, the life of the printed circuit board 300A, that is, the life of the digital camera can be extended.

In addition, since the member 501 is disposed around the opening H1, the thermosetting resin 451A can be prevented from flowing to the portion C1 in which the image is formed. Thus, the image of the portion C1 can be checked with a scanner or the like (not illustrated) through the opening H1.

In addition, since the members 501, 502, and 503 are respectively disposed around the openings H1, H2, and H3, the thermosetting resin 451A can be prevented from flowing to the lands 131A, 132A, and 133A. Thus, since the solder wettability of the lands 131A, 132A, and 133A can be prevented from being lowered, the bonding force of solder on the lands 131A, 132A, and 133A can be kept.

Third Embodiment

Figure 12:
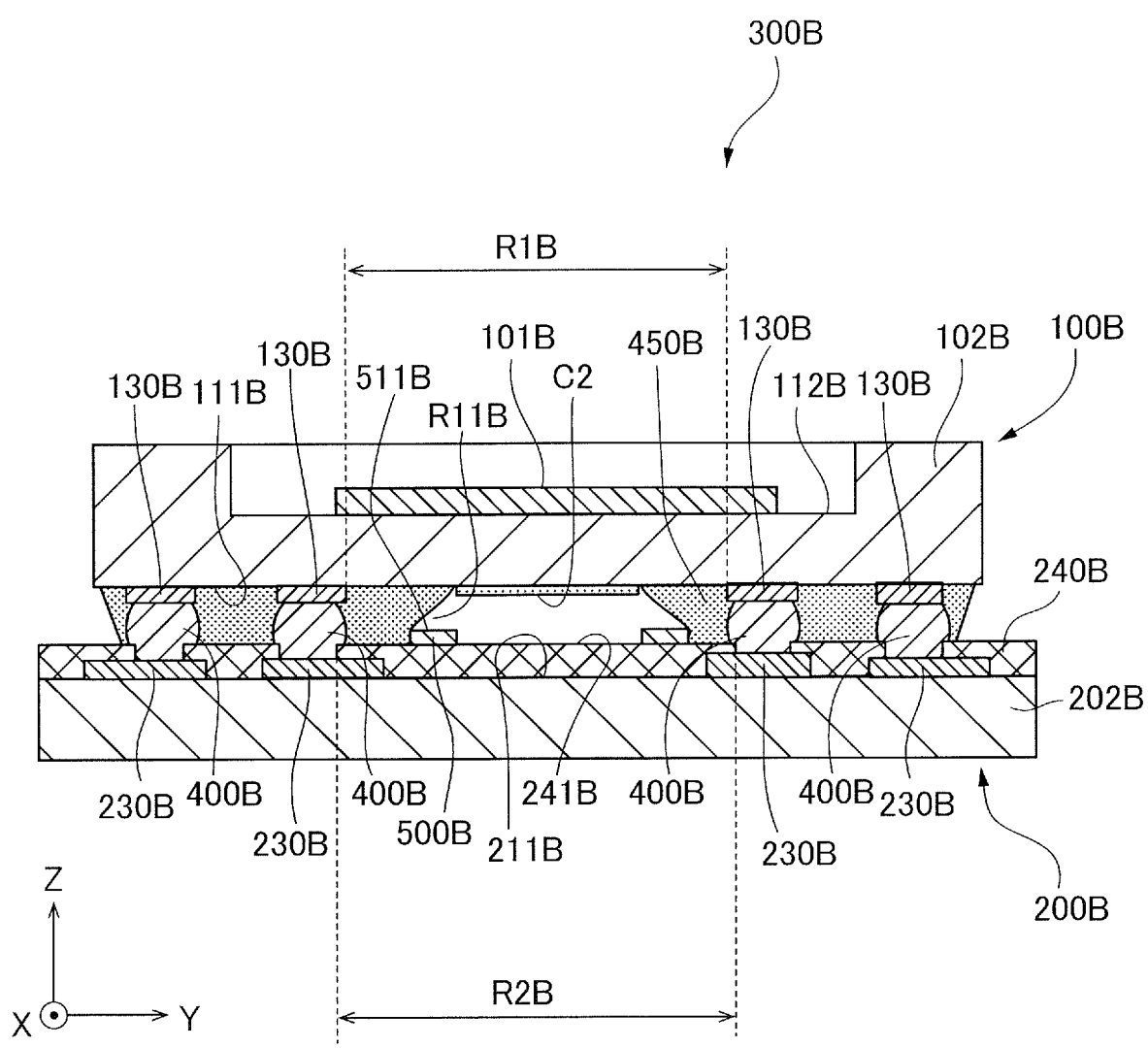
FIG. 12 is a cross-sectional view of a printed circuit board of a third embodiment.

Next, a printed circuit board of an image pickup device of a third embodiment will be described. FIG. 12 is a cross-sectional view of a printed circuit board 300B of the third embodiment. The image pickup device of the third embodiment includes the printed circuit board 300B, instead of the printed circuit board 300 of FIG. 1. The printed circuit board 300B includes an image sensor 100B which is one example of electronic components, and a printed wiring board 200B on which the image sensor 100B is mounted. The image sensor 100B may be a CMOS image sensor or a CCD image sensor. The image sensor 100B is an LGA package. Alternatively, the image sensor 100B may be an LCC package. The image sensor 100B includes a sensor element 101B which is a semiconductor element, an insulating substrate 102B which is a first base, and a plurality of lands 130B which are first lands. The lands 130B are disposed on a main surface 111B of the insulating substrate 102B. The main surface 111B is a first main surface. The sensor element 101B is disposed on a surface 112B of the insulating substrate 102B, opposite to the main surface 111B. The lands 130B are electrodes made of electrically conductive metal, such as copper. For example, each of the lands 130B is a signal electrode, a power electrode, a ground electrode, or a dummy electrode.

Figure 13A:
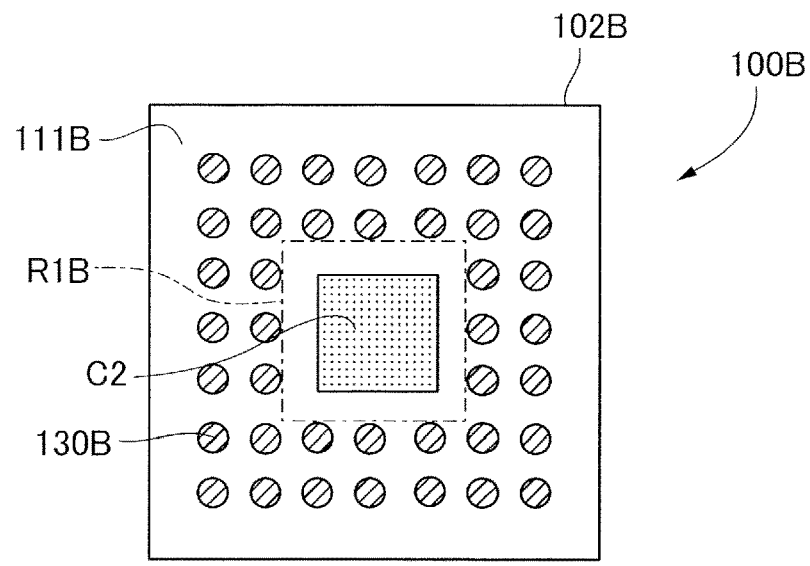
FIG. 13A is a plan view of an image sensor of the third embodiment, as viewed from a first main surface side of the image sensor.
Figure 13A:
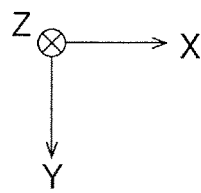

FIG. 13A is a plan view of the image sensor 100B, as viewed from the main surface 111B side. The lands 130B are circular in the plan view, but are not limited to this. For example, the lands 130B may be shaped like a polygon or a cross in the plan view. The insulating substrate 102B may be made of ceramic material.

As illustrated in FIG. 12, the printed wiring board 200B includes an insulating substrate 202B which is a second base, and a plurality of lands 230B which are second lands. The lands 230B are disposed on a main surface 211B of the insulating substrate 202B. The main surface 211B is a second main surface. The lands 230B are electrodes made of electrically conductive metal, such as copper. For example, each of the lands 230B is a signal electrode, a power electrode, a ground electrode, or a dummy electrode. The insulating substrate 202B is made of insulating material, such as epoxy resin.

Figure 13B:
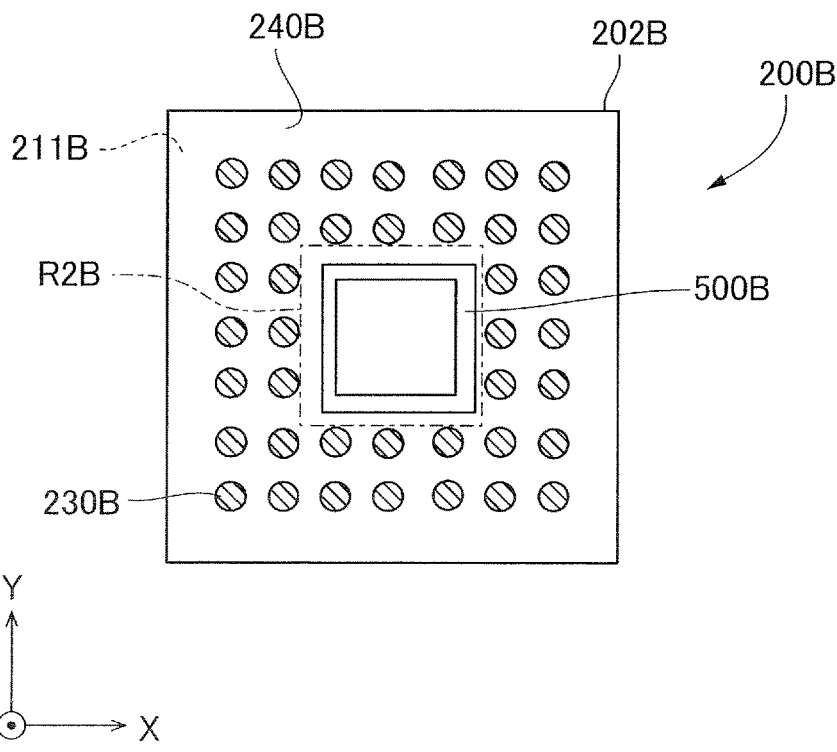
FIG. 13B is a plan view of a printed wiring board of the third embodiment, as viewed from a second main surface side of the printed wiring board.
Figure 13B:
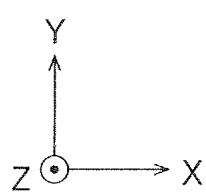

The printed wiring board 200B includes a solder resist 240B. The solder resist 240B is a film formed on the main surface 211B. The lands 230B are SMD lands in the present embodiment, but are not limited to those. The lands 230B may be NSMD lands. Alternatively, the solder resist 240B may not be formed on the printed wiring board 200B. FIG. 13B is a plan view of the printed wiring board 200B, as viewed from the main surface 211B side. The lands 230B are circular in the plan view, but are not limited to this. For example, the lands 230B may be shaped like a polygon or a cross in the plan view.

As illustrated in FIG. 12, the lands 130B and the lands 230B are bonded with each other via bonding portions 400B which contain solder. The bonding portions 400B are covered with a resin portion 450B which is an underfill. The resin portion 450B is made of thermally cured resin. In the present embodiment, the plurality of bonding portions 400B are covered with the resin portion 450B formed as one body. The plurality of bonding portions 400B are preferably covered with the resin portion 450B formed as one body, but are not limited to this. For example, the bonding portions 400B may be covered with a plurality of resin portions separated from each other.

As illustrated in FIG. 13A, the plurality of lands 130B are disposed, spaced from each other, around a portion R1B of the main surface 111B. The portion R1B is a first portion, and includes a center of the main surface 111B. As illustrated in FIG. 13B, the plurality of lands 230B are disposed, spaced from each other, around a portion R2B of the main surface 211B. The portion R2B is a second portion. The lands 230B are disposed at positions corresponding to positions of the lands 130B. The portion RIB and the portion R2B face each other.

As illustrated in FIG. 13A, in the present embodiment, the portion R1B includes a portion C2 in which an image is formed. The image formed in the portion C2 is, for example, a DataMtrix code, a QR code (registered trademark), a bar code, a character, a numeric character, a mark, or a combination thereof. The image formed in the portion C2 is used to check the specifications or the like of the image sensor 100B when the camera is manufactured or repaired.

In the present embodiment, a member 500B having a property to repel uncured thermosetting resin is disposed on one of the portions R1B and R2B, that is, on the portion R2B. The member 500 may be disposed on both of the portions R1B and R2B. Components of the member 500B are the same as those of the member 500 of the first embodiment. As illustrated in FIG. 13B, the member 500B is shaped like a loop. The member 500B has a surface 511B facing the portion R1B, which is the other portion. Above the surface 511B of the member 500B, there is a space R11B in which the resin portion 450B is not formed.

The members 500B may be disposed in contact with the portion R2B of the main surface 211B. However, since the solder resist 240B is disposed on the main surface 211B in the present embodiment, the member 500B is disposed not in contact with the portion R2B of the main surface 211B, but in contact with the solder resist 240B. That is, the member 500B is disposed on a portion of the solder resist 240B which is above the portion R2B.

Next, a method for manufacturing the printed circuit board 300B will be described. FIGS. 14A, 14B, 14C, 15A, 15B, and 15C are diagrams illustrating processes to make the printed circuit board 300B of FIG. 12.

Figure 14A:
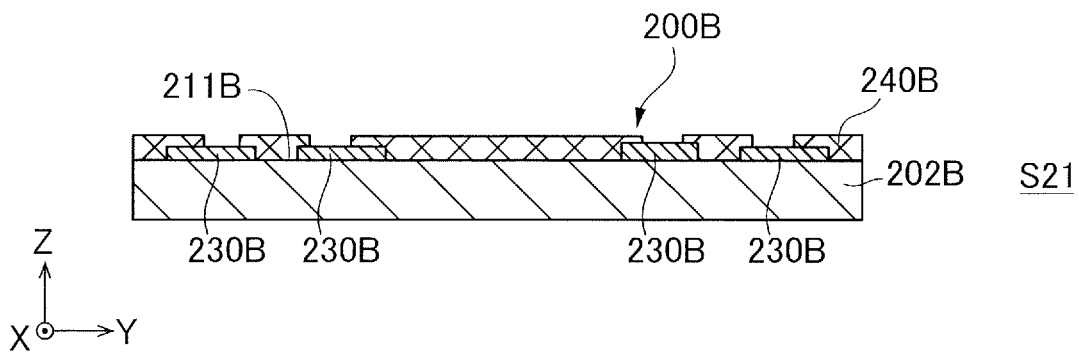
FIG. 14A is a diagram illustrating a method for manufacturing the printed circuit board of the third embodiment.
Figure 14B:
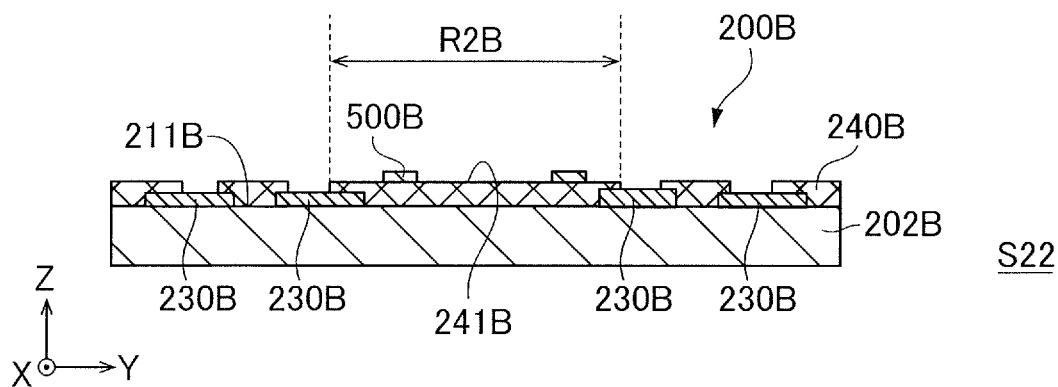
FIG. 14B is a diagram illustrating the method for manufacturing the printed circuit board of the third embodiment.
Figure 14C:
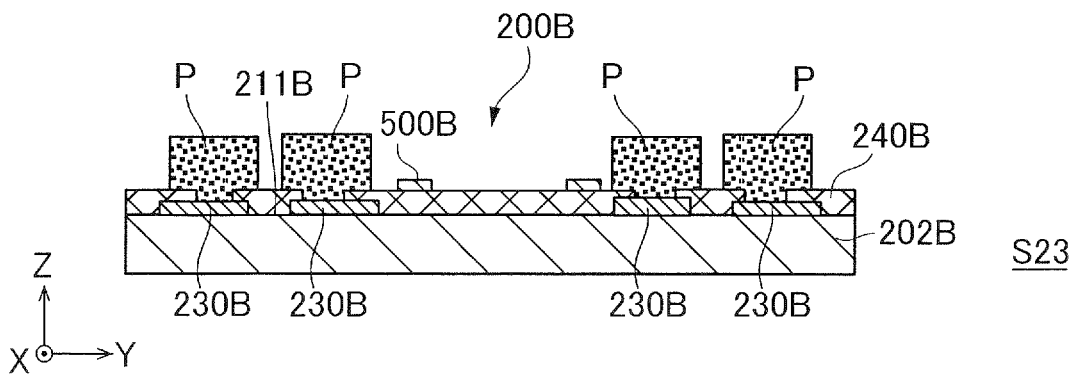
FIG. 14C is a diagram illustrating the method for manufacturing the printed circuit board of the third embodiment.

As illustrated in FIG. 14A, the printed wiring board 200B is prepared (Step S21). In Step S21, the image sensor 100B is also prepared. Then, the member 500B having a property to repel uncured thermosetting resin is disposed on one of the portion RIB illustrated in FIG. 13A and the portion R2B illustrated in FIG. 13B, that is, on the portion R2B, as illustrated in FIG. 14B (Step S22). The member 500B may be disposed on both of the portions R1B and R2B. Then, a paste P is disposed on one of the land 130B illustrated in FIG. 13A and the land 230B illustrated in FIG. 13B, that is, on the land 230B, as illustrated in FIG. 14C (Step S23). The paste P may be disposed on both of the lands 130B and 230B. The thickness of the member 500B, which is formed on the solder resist 240B and has a property to repel uncured thermosetting resin, may be equal to or smaller than the thickness of the paste P. Although Step S23 is performed after Step S22, Step S23 may be performed before Step S22. In another case, Step S22 and Step S23 may be performed simultaneously. That is, Step S22 and Step S23 have only to be performed before later-described Step S24.

In Step S22, a jig (not illustrated) or a stamp (not illustrated) such as a rubber stamp is used to dispose the member 500B on the insulating substrate 202B, that is, on the solder resist 240B. The method of disposing the member 500B is not limited to this. For example, the member 500B may be disposed on the printed wiring board 200B by using screen printing or a dispenser.

In Step S23, the paste P is supplied onto the printed wiring board 200B by using screen printing or a dispenser. The paste P may be supplied so as to cover all or part of each land 230B.

Figure 15A:
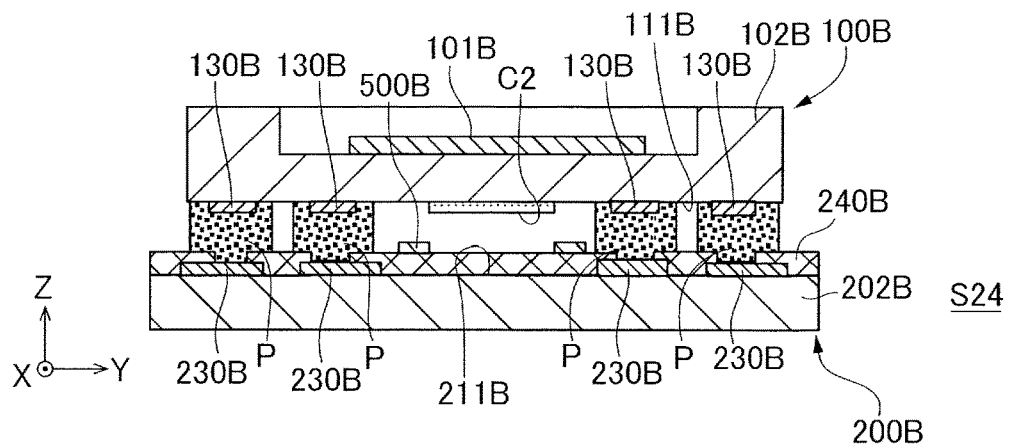
FIG. 15A is a diagram illustrating the method for manufacturing the printed circuit board of the third embodiment.

Then, as illustrated in FIG. 15A, the image sensor 100B is placed on the printed wiring board 200B such that the paste P is sandwiched between the lands 130B and the lands 230B (Step S24). In the present embodiment, in Step S24, the image sensor 100B is placed on the printed wiring board 200B by using a mounter (not illustrated). In this time, the image sensor 100B is first positioned at a position at which the lands 130B face the lands 230B, and then the image sensor 100B is placed on the printed wiring board 200B.

Figure 15B:
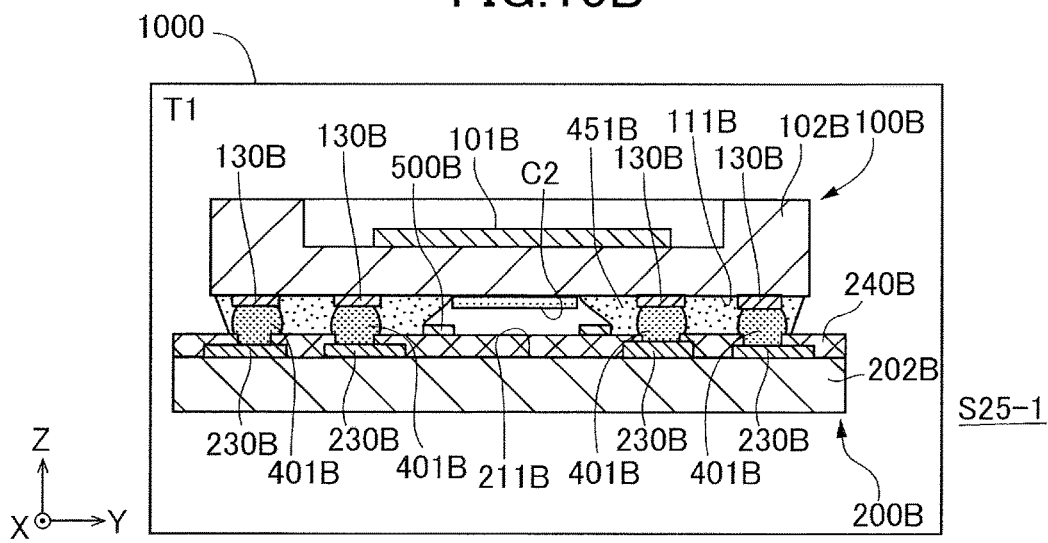
FIG. 15B is a diagram illustrating the method for manufacturing the printed circuit board of the third embodiment.

Then, as illustrated in FIG. 15B, the image sensor 100B and the printed wiring board 200B are conveyed into a reflow furnace 1000, in a state where the image sensor 100B is placed on the printed wiring board 200B. In Step S25-1 illustrated in FIG. 15B and Step S25-2 illustrated in FIG. 15C, the image sensor 100B and the printed wiring board 200B are bonded with each other with solder, by heating the paste P while adjusting the heating temperature of the reflow furnace 1000.

In Step S25-1 illustrated in FIG. 15B, the temperature of the reflow furnace 1000 is adjusted to a first temperature T1 equal to or higher than a melting temperature of the solder powder of the paste P. With this operation, the solder powder of the paste P is melted, and the paste P is separated into a molten solder 401B and an uncured thermosetting resin 451B. Specifically, the thermosetting resin 451B moves to the periphery of the molten solder 401B. The first temperature T1 is preferably constant over time, but may fluctuate.

Figure 15C:
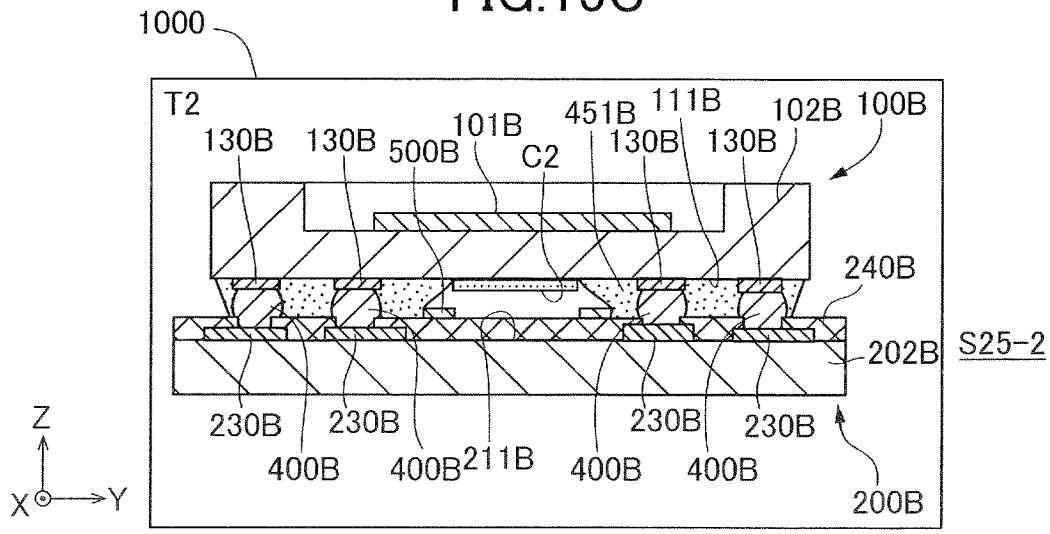
FIG. 15C is a diagram illustrating the method for manufacturing the printed circuit board of the third embodiment.

In Step S25-2 illustrated in FIG. 15C, the molten solder 401B is solidified by adjusting the temperature of the reflow furnace 1000 to a second temperature T2 lower than the solder melting point (T2<T1). With this operation, the bonding portions 400B to bond the lands 130B and the lands 230B are formed.

The second temperature T2 is a temperature at which the thermosetting resin 451B is also solidified. The temperature of the reflow furnace 1000 is kept at the second temperature T2 for a period of time equal to or longer than a period of time necessary to harden the thermosetting resin 451B. With this operation, the thermosetting resin 451B is gradually cured, and the resin portion 450B illustrated in FIG. 12 is formed. The second temperature T2 is preferably constant over time, but may fluctuate.

The resin portion 450B illustrated in FIG. 12 reinforces the bonding portions 400B. More specifically, the resin portion 450B reinforces contact portions between the bonding portions 400B and the lands 130B, and contact portions between the bonding portions 400B and the lands 230B, thus increasing reliability of bonding of the bonding portions 400B.

In the present embodiment, the member 500B having a property to repel the uncured thermosetting resin 451B is formed on the portion R2B. The member 500B prevents the thermosetting resin 451B from flowing over the member 500B.

Figure 16A:
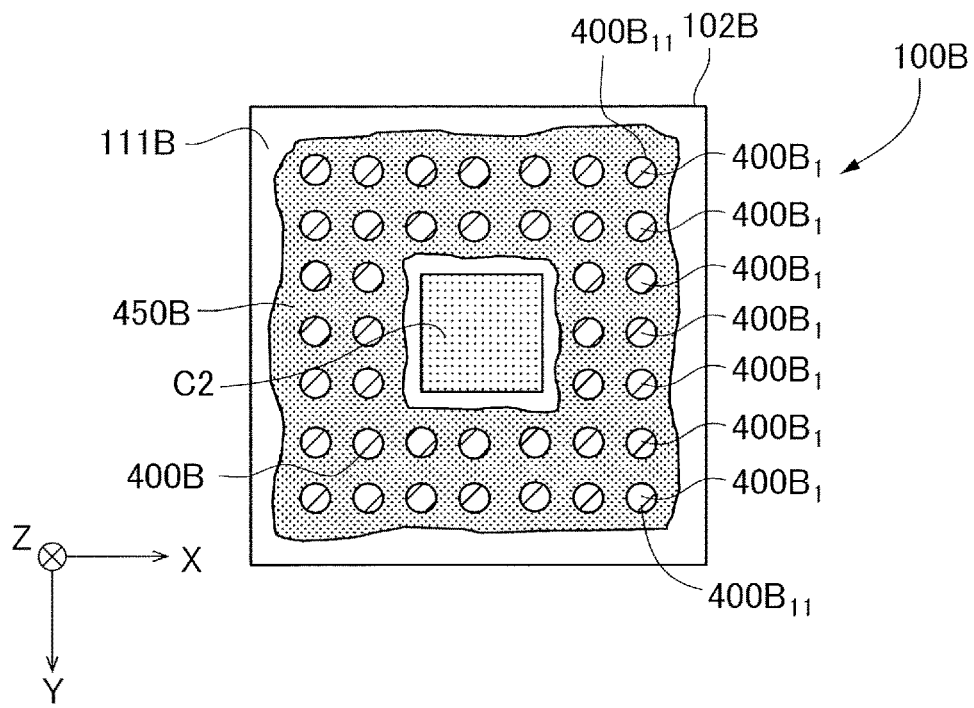
FIG. 16A is a schematic diagram of the image sensor, obtained by cutting bonding portions and a resin portion of the printed circuit board of the third embodiment.
Figure 16B:
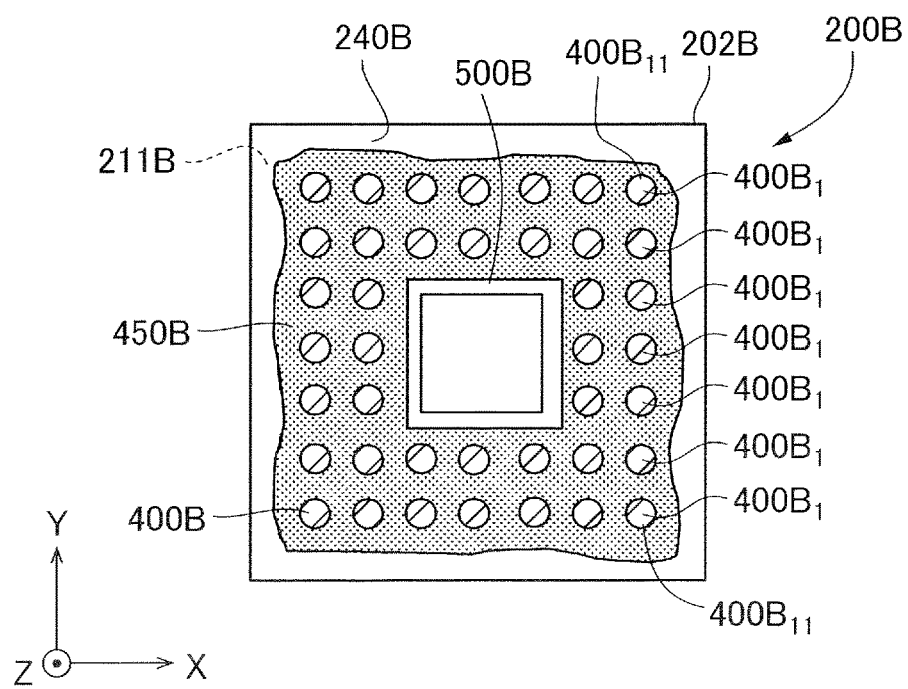
FIG. 16B is a schematic diagram of the printed wiring board, obtained by cutting the bonding portions and the resin portion of the printed circuit board of the third embodiment.

FIG. 16A is a schematic diagram of the image sensor 100B, obtained by cutting the bonding portions 400B and the resin portion 450B of the printed circuit board 300B of FIG. 12, along the XY-direction which is an in-plane direction. FIG. 16B is a schematic diagram of the printed wiring board 200B, obtained by cutting the bonding portions 400B and the resin portion 450B of the printed circuit board 300B of FIG. 12, along the XY-direction which is an in-plane direction.

As illustrated in FIGS. 16A and 16B, the resin portion 450B is formed, indicating that the thermosetting resin 451B was prevented from flowing over the member 500B and cured. In this formation, the amount of resin of the resin portion 450B does not become insufficient in the periphery of each of the bonding portions 400B, in particular, in the periphery of each of outermost bonding portions $400B_1$ of the plurality of bonding portions 400B. That is, since the thermosetting resin 451B can be prevented from flowing to the center portion of the image sensor 100B in which no bonding portions are formed, more resin can be left in the periphery of each of the bonding portions 400B, in particular, in the periphery of each of the outermost bonding portions $400B_1$. In addition, more resin can be left also in the periphery of each of corner bonding portions $400B_{11}$ of the outermost bonding portions $400B_1$.

When the environment around the digital camera such as the temperature around the digital camera changes, stress will be applied to the bonding portions 400B due to the difference in linear-expansion coefficient between the image sensor 100B and the printed wiring board 200B. In addition, when the digital camera falls, force of impact will be applied to the bonding portions 400B. In the present embodiment, however, since the bonding portions 400B are reinforced by the resin portion 450B, the bonding portions 400B can be prevented from being broken even when the stress, caused when the temperature changes, or the force of impact, caused when the digital camera falls, is applied. Thus, the reliability of bonding of the bonding portions 400B is improved. Since the reliability of bonding of each of the bonding portions 400B is increased, the electrical and mechanical connection is kept for a long time. Therefore, the life of the printed circuit board 300B, that is, the life of the digital camera can be extended.

In addition, since the member 500B is disposed on the portion R2B, the thermosetting resin 451B can be prevented from flowing to the portion C2 in which the image is formed. Therefore, when the image sensor 100B is removed from the printed wiring board 200B in maintenance such as repair, the image formed in the portion C2 can be checked with a scanner (not illustrated) or the like because the image is not covered with the resin.

Fourth Embodiment

Figure 17:
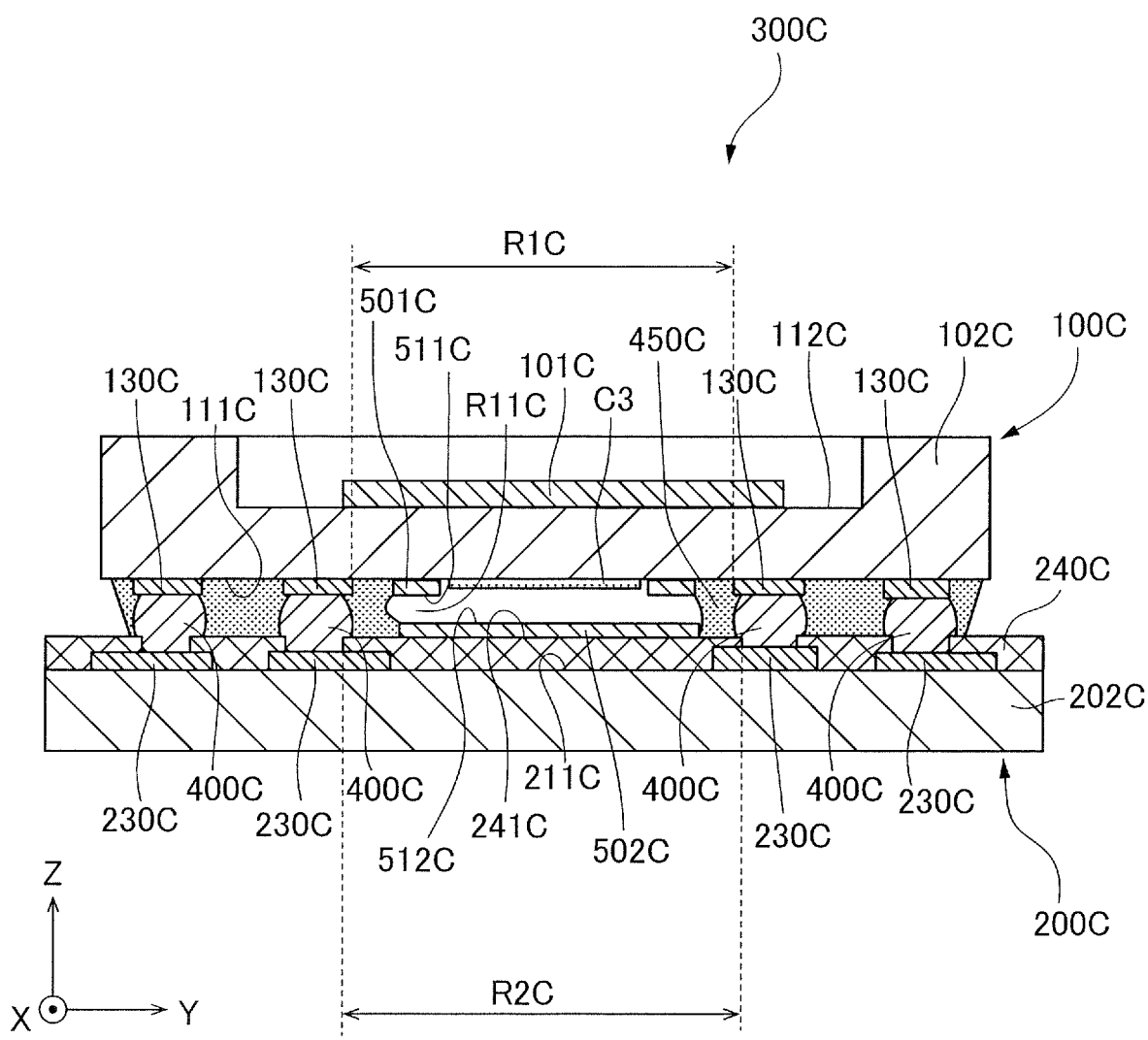
FIG. 17 is a cross-sectional view of a printed circuit board of a fourth embodiment.

Next, a printed circuit board of an image pickup device of a fourth embodiment will be described. FIG. 17 is a cross-sectional view of a printed circuit board 300C of the fourth embodiment. The image pickup device of the fourth embodiment includes the printed circuit board 300C, instead of the printed circuit board 300 of FIG. 1. The printed circuit board 300C includes an image sensor 100C which is one example of electronic components, and a printed wiring board 200C on which the image sensor 100C is mounted. The image sensor 100C may be a CMOS image sensor or a CCD image sensor. The image sensor 100C is an LGA package. Alternatively, the image sensor 100C may be an LCC package. The image sensor 100C includes a sensor element 101C which is a semiconductor element, an insulating substrate 102C which is a first base, and a plurality of lands 130C which are first lands. The lands 130C are disposed on a main surface 111C of the insulating substrate 102C. The main surface 111C is a first main surface. The sensor element 101C is disposed on a surface 112C of the insulating substrate 102C, opposite to the main surface 111C. The lands 130C are electrodes made of electrically conductive metal, such as copper. For example, each of the lands 130C is a signal electrode, a power electrode, a ground electrode, or a dummy electrode.

Figure 18A:
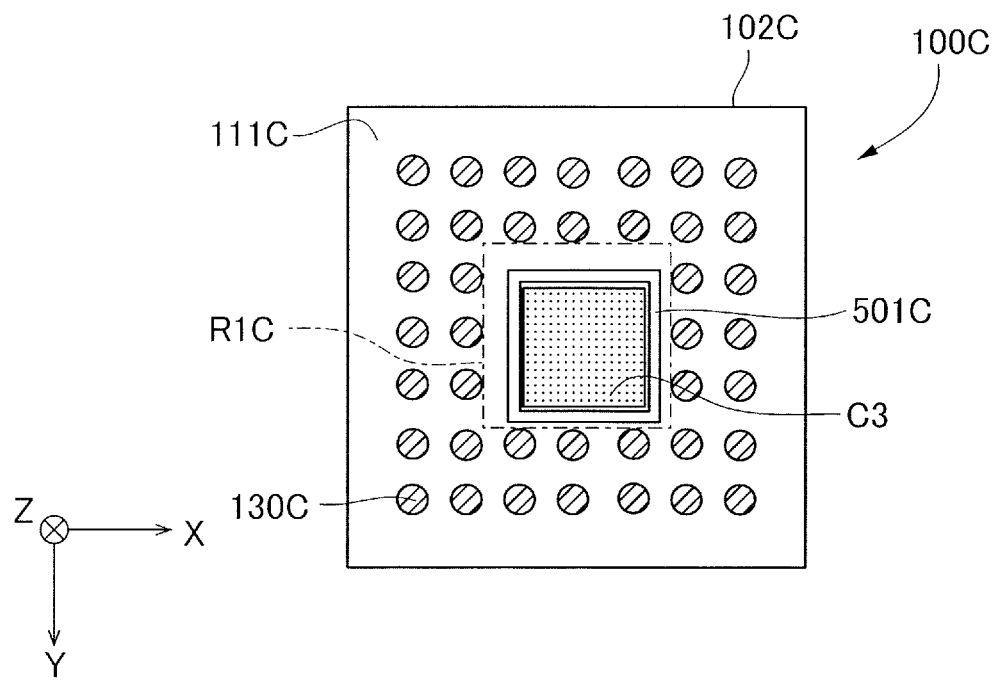
FIG. 18A is a plan view of an image sensor of the fourth embodiment, as viewed from a first main surface side of the image sensor.

FIG. 18A is a plan view of the image sensor 100C, as viewed from the main surface 111C side. The lands 130C are circular in the plan view, but are not limited to this. For example, the lands 130C may be shaped like a polygon or a cross in the plan view. The insulating substrate 102C may be made of ceramic material.

As illustrated in FIG. 17, the printed wiring board 200C includes an insulating substrate 202C which is a second base, and a plurality of lands 230C which are second lands. The lands 230C are disposed on a main surface 211C of the insulating substrate 202C. The main surface 211C is a second main surface. The lands 230C are electrodes made of electrically conductive metal, such as copper. For example, each of the lands 230C is a signal electrode, a power electrode, a ground electrode, or a dummy electrode. The insulating substrate 202C is made of insulating material, such as epoxy resin.

Figure 18B:
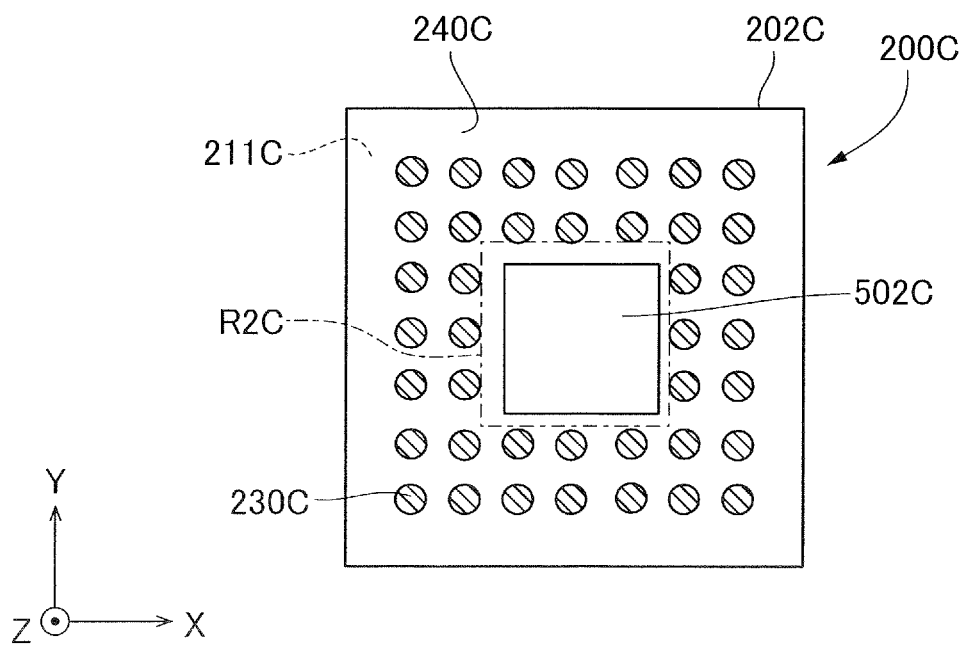
FIG. 18B is a plan view of a printed wiring board of the fourth embodiment, as viewed from a second main surface side of the printed wiring board.

The printed wiring board 200C includes a solder resist 240C. The solder resist 240C is a film formed on the main surface 211C. The lands 230C are SMD lands in the present embodiment, but are not limited to those. The lands 230C may be NSMD lands. Alternatively, the solder resist 240C may not be formed on the printed wiring board 200C. FIG. 18B is a plan view of the printed wiring board 200C, as viewed from the main surface 211C side. The lands 230C are circular in the plan view, but are not limited to this. For example, the lands 230C may be shaped like a polygon or a cross in the plan view.

As illustrated in FIG. 17, the lands 130C and the lands 230C are bonded with each other via bonding portions 400C which contain solder. The bonding portions 400C are covered with a resin portion 450C which is an underfill. The resin portion 450C is made of thermally cured resin. In the present embodiment, the plurality of bonding portions 400C are covered with the resin portion 450C formed as one body. The plurality of bonding portions 400C are preferably covered with the resin portion 450C formed as one body, but are not limited to this. For example, the bonding portions 400C may be covered with a plurality of resin portions separated from each other.

As illustrated in FIG. 18A, the plurality of lands 130C are disposed, spaced from each other, around a portion R1C of the main surface 111C. The portion R1C is a first portion, and includes a center of the main surface 111C. As illustrated in FIG. 18B, the plurality of lands 230C are disposed, spaced from each other, around a portion R2C of the main surface 211C. The portion R2C is a second portion. The lands 230C are disposed at positions corresponding to positions of the lands 130C. The portion R1C and the portion R2C face each other.

As illustrated in FIG. 18A, in the present embodiment, the portion R1C includes a portion C3 in which an image is formed. The image formed in the portion C3 is, for example, a DataMtrix code, a QR code (registered trademark), a bar code, a character, a numeric character, a mark, or a combination thereof. The image formed in the portion C3 is used to check the specifications or the like of the image sensor 100C when the camera is manufactured or repaired.

In the present embodiment, a member 502C having a property to repel uncured thermosetting resin and serving as a first member is disposed on the portion R2C, and a member 501C having a property to repel uncured thermosetting resin and serving as a second member is disposed on the portion R1C. Components of the members 501C and 502C are the same as those of the member 500 of the first embodiment. As illustrated in FIG. 18A, the member 501C is disposed around the portion C3. The member 501C is shaped like a loop. The member 501C has a surface 511C facing the portion R2C. The member 502C has a surface 512C facing the portion R1C. In the present embodiment, the surface 511C faces the surface 512C. In addition, above the surface 512C and below the surface 511C, that is, between the surface 512C and the surface 511C, there is a space R11C in which the resin portion 450C is not formed.

The member 502C may be disposed in contact with the portion R2C of the main surface 211C. However, since the solder resist 240C is disposed on the main surface 211C in the present embodiment, the member 502C is disposed not in contact with the portion R2C of the main surface 211C, but in contact with the solder resist 240C. That is, the member 502C is disposed on a portion of the solder resist 240C which is above the portion R2C.

As illustrated in FIG. 17, the member 502C faces the portion C3, in the portion R2C. In the present embodiment, the member 502C faces the whole surface of the portion C3.

Next, a method for manufacturing the printed circuit board 300C will be described. FIGS. 19A, 19B, 19C, 20A, 20B, and 20C are diagrams illustrating processes to make the printed circuit board 300C of FIG. 17.

Figure 19A:
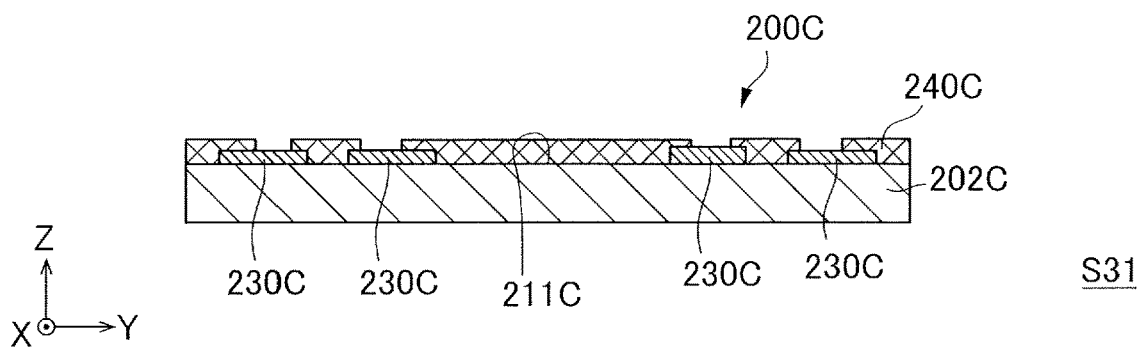
FIG. 19A is a diagram illustrating a method for manufacturing the printed circuit board of the fourth embodiment.
Figure 19B:
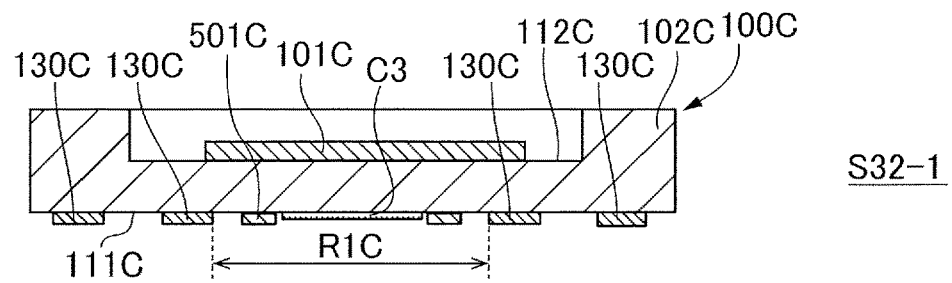
FIG. 19B is a diagram illustrating the method for manufacturing the printed circuit board of the fourth embodiment.
Figure 19B:
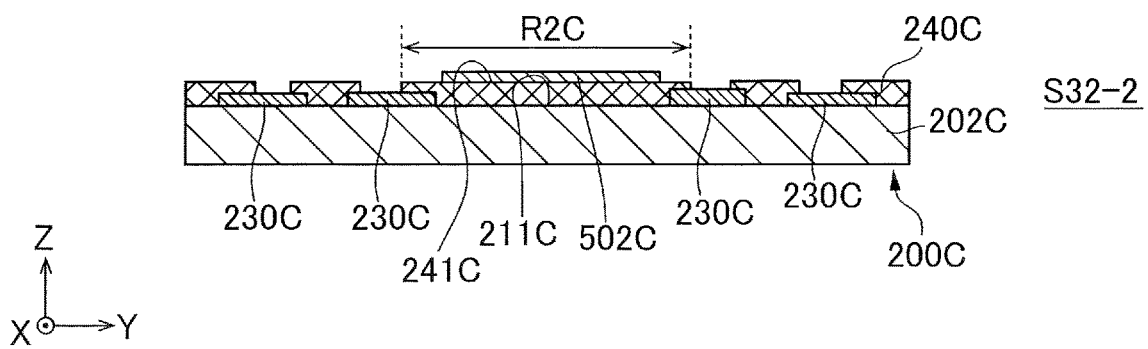

As illustrated in FIG. 19A, the printed wiring board 200C is prepared (Step S31). In Step S31, the image sensor 100C is also prepared. Then, the members 501C and 502C having a property to repel uncured thermosetting resin are respectively disposed on the portion R1C illustrated in FIG. 18A and on the portion R2C illustrated in FIG. 18B. As illustrated in FIG. 19B, in the present embodiment, the member 502C, which is the first member, is disposed on the portion R2C (Step S32-2), and the member 501C, which is the second member, is disposed on the portion R1C (Step S32-1). In Step S32-1, the member 501C is disposed on the portion R1C, around the portion C3. In Step S32-2, the member 502C is disposed on the portion R2C so as to face the portion C3.

Figure 19C:
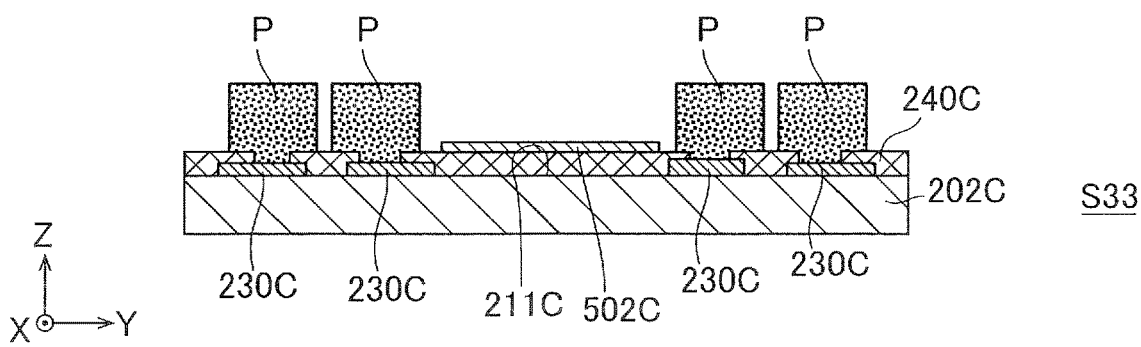
FIG. 19C is a diagram illustrating the method for manufacturing the printed circuit board of the fourth embodiment.

Then, a paste P is disposed on one of the land 130C illustrated in FIG. 18A and the land 230C illustrated in FIG. 18B, that is, on the land 230C, as illustrated in FIG. 19C (Step S33). The paste P may be disposed on both of the lands 130C and 230C. The thickness of the members 501C and 502C, which have a property to repel uncured thermosetting resin, may be equal to or smaller than the thickness of the paste P. Although Step S33 is performed after Step S32, Step S33 may be performed before Step S32. In another case, Step S32 and Step S33 may be performed simultaneously. That is, Step S32 and Step S33 have only to be performed before later-described Step S34.

In Step S32, a jig (not illustrated) or a stamp (not illustrated) such as a rubber stamp is used to dispose the member 501C on the insulating substrate 102C, and the member 502C on the insulating substrate 202C, that is, on the solder resist 240C. The method of disposing the members 501C and 502C is not limited to this. For example, the members 501C and 502C may be respectively disposed on the image sensor 100C and the printed wiring board 200C by using screen printing or a dispenser.

In Step S33, the paste P is supplied onto the printed wiring board 200C by using screen printing or a dispenser. The paste P may be supplied so as to cover all or part of each land 230C.

Figure 20A:
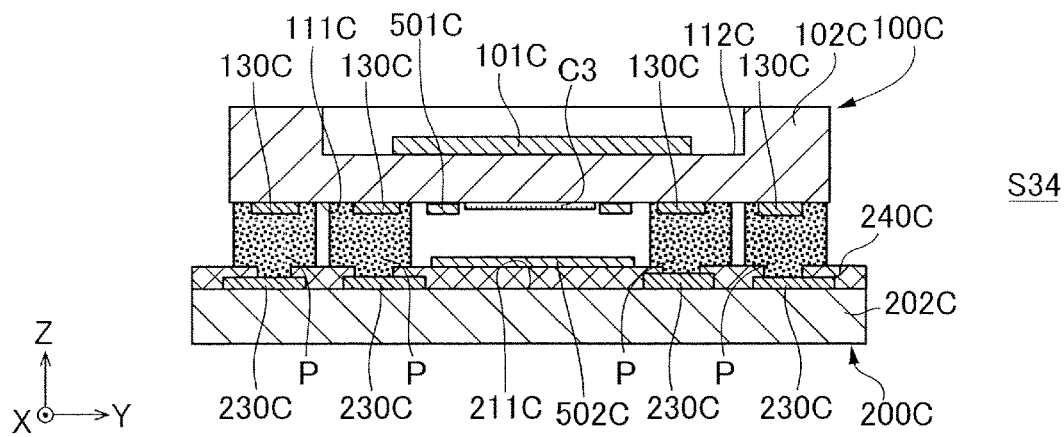
FIG. 20A is a diagram illustrating the method for manufacturing the printed circuit board of the fourth embodiment.

Then, as illustrated in FIG. 20A, the image sensor 100C is placed on the printed wiring board 200C such that the paste P is sandwiched between the lands 130C and the lands 230C (Step S34). In the present embodiment, in Step S34, the image sensor 100C is placed on the printed wiring board 200C by using a mounter (not illustrated). In this time, the image sensor 100C is first positioned at a position at which the lands 130C face the lands 230C, and then the image sensor 100C is placed on the printed wiring board 200C.

Figure 20B:
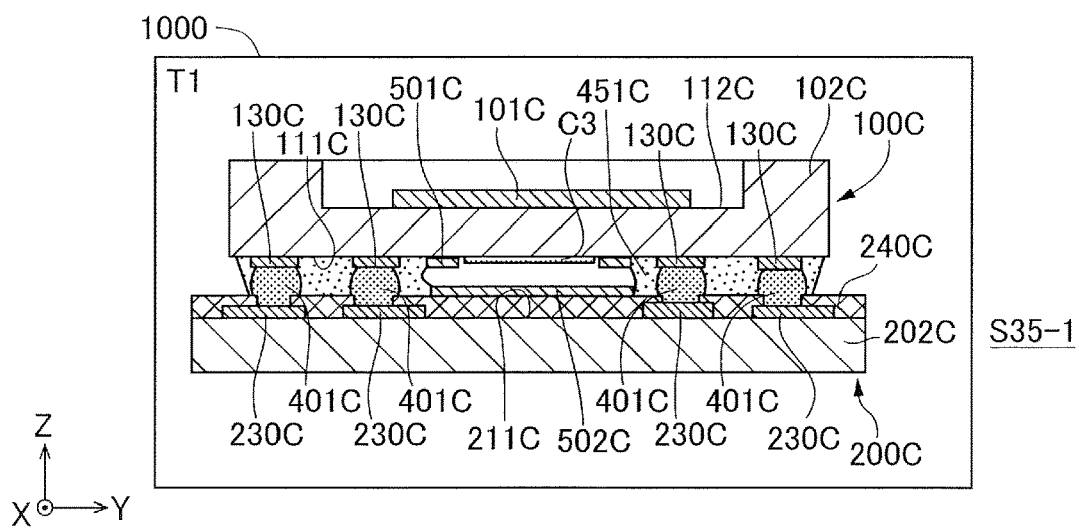
FIG. 20B is a diagram illustrating the method for manufacturing the printed circuit board of the fourth embodiment.

Then, as illustrated in FIG. 20B, the image sensor 100C and the printed wiring board 200C are conveyed into a reflow furnace 1000, in a state where the image sensor 100C is placed on the printed wiring board 200C. In Step S35-1 illustrated in FIG. 20B and Step S35-2 illustrated in FIG. 20C, the image sensor 100C and the printed wiring board 200C are bonded with each other with solder, by heating the paste P while adjusting the heating temperature of the reflow furnace 1000.

In Step S35-1 illustrated in FIG. 20B, the temperature of the reflow furnace 1000 is adjusted to a first temperature T1 equal to or higher than a melting temperature of the solder powder of the paste P. With this operation, the solder powder of the paste P is melted, and the paste P is separated into a molten solder 401C and an uncured thermosetting resin 451C. Specifically, the thermosetting resin 451C moves to the periphery of the molten solder 401C. The first temperature T1 is preferably constant over time, but may fluctuate.

Figure 20C:
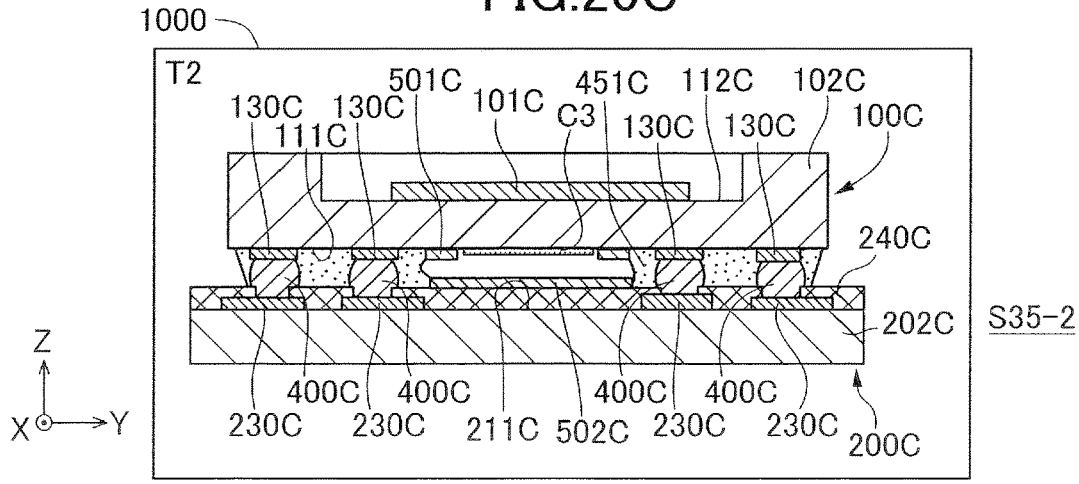
FIG. 20C is a diagram illustrating the method for manufacturing the printed circuit board of the fourth embodiment.

In Step S35-2 illustrated in FIG. 20C, the molten solder 401C is solidified by adjusting the temperature of the reflow furnace 1000 to a second temperature T2 lower than the solder melting point (T2<T1). With this operation, the bonding portions 400C to bond the lands 130C and the lands 230C are formed.

The second temperature T2 is a temperature at which the thermosetting resin 451C is also solidified. The temperature of the reflow furnace 1000 is kept at the second temperature T2 for a period of time equal to or longer than a period of time necessary to harden the thermosetting resin 451C. With this operation, the thermosetting resin 451C is gradually cured, and the resin portion 450C illustrated in FIG. 17 is formed. The second temperature T2 is preferably constant over time, but may fluctuate.

The resin portion 450C illustrated in FIG. 17 reinforces the bonding portions 400C. More specifically, the resin portion 450C reinforces contact portions between the bonding portions 400C and the lands 130C, and contact portions between the bonding portions 400C and the lands 230C, thus increasing reliability of bonding of the bonding portions 400C.

In the present embodiment, the members 501C and 502C having a property to repel the uncured thermosetting resin 451C are respectively formed on the portions RIC and R2C. The members 501C and 502C prevent the thermosetting resin 451C from flowing over the members 501C and 502C.

Figure 21A:
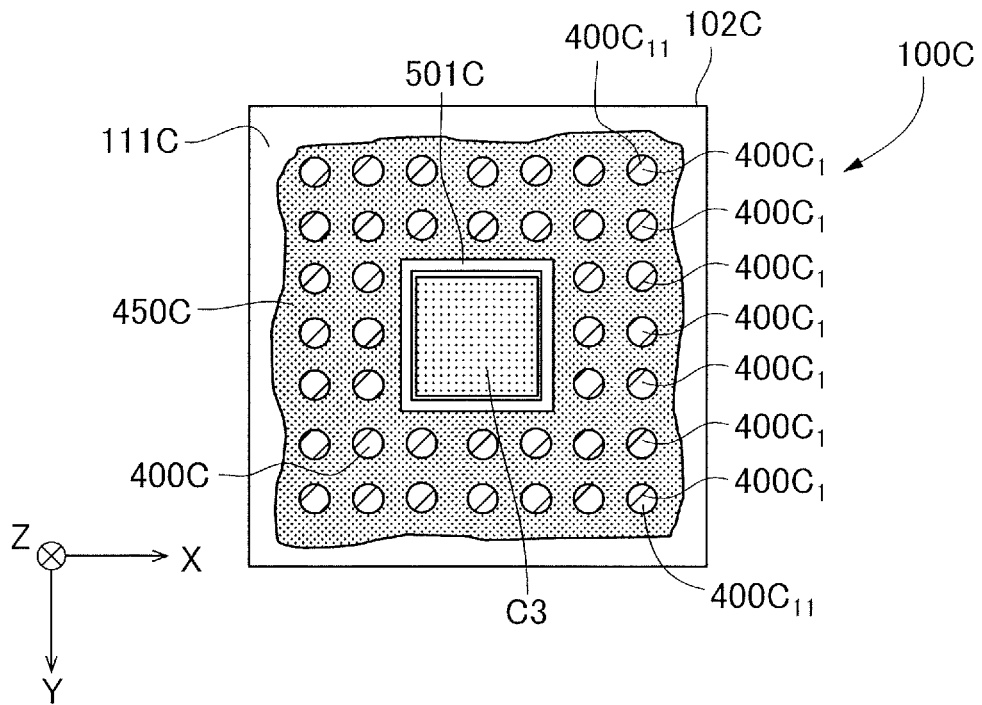
FIG. 21A is a schematic diagram of the image sensor, obtained by cutting bonding portions and a resin portion of the printed circuit board of the fourth embodiment.
Figure 21B:
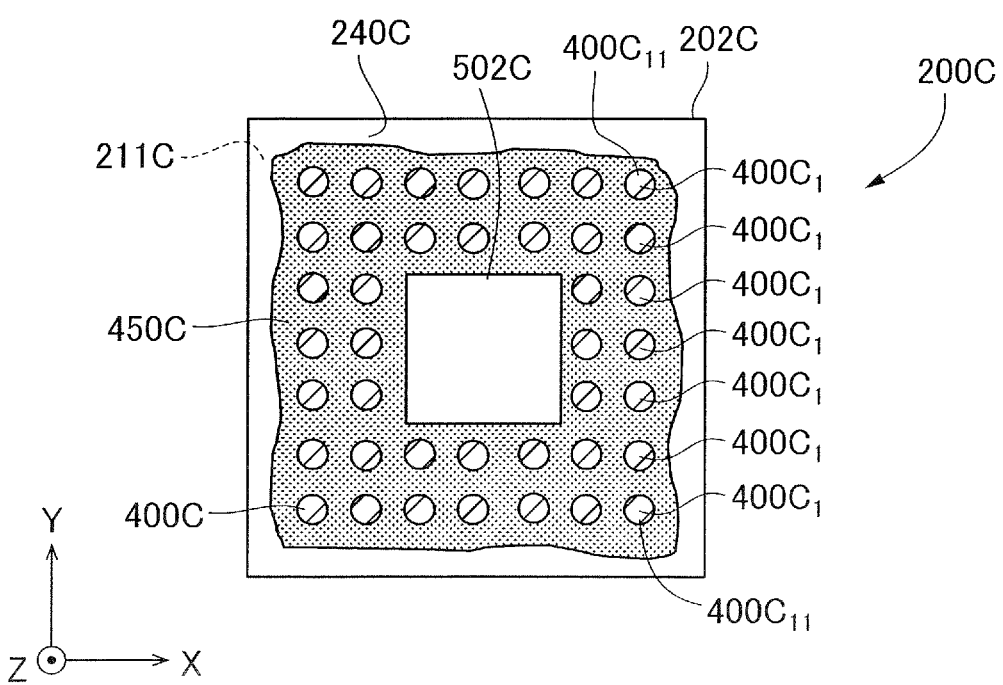
FIG. 21B is a schematic diagram of the printed wiring board, obtained by cutting the bonding portions and the resin portion of the printed circuit board of the fourth embodiment.

FIG. 21A is a schematic diagram of the image sensor 100C, obtained by cutting the bonding portions 400C and the resin portion 450C of the printed circuit board 300C of FIG. 17, along the XY-direction which is an in-plane direction. FIG. 21B is a schematic diagram of the printed wiring board 200C, obtained by cutting the bonding portions 400C and the resin portion 450C of the printed circuit board 300C of FIG. 17, along the XY-direction which is an in-plane direction.

As illustrated in FIGS. 21A and 21B, the resin portion 450C is formed, indicating that the thermosetting resin 451C was prevented from flowing over the members 501C and 502C and cured. In this formation, the amount of resin of the resin portion 450C does not become insufficient in the periphery of each of the bonding portions 400C, in particular, in the periphery of each of outermost bonding portions $400C_1$ of the plurality of bonding portions 400C. That is, since the thermosetting resin 451C can be prevented from flowing to the center portion of the image sensor 100C in which no bonding portions are formed, more resin can be left in the periphery of each of the bonding portions 400C, in particular, in the periphery of each of the outermost bonding portions $400C_1$. In addition, more resin can be left also in the periphery of each of corner bonding portions $400C_{11}$ of the outermost bonding portions $400C_1$.

When the environment around the digital camera such as the temperature around the digital camera changes, stress will be applied to the bonding portions 400C due to the difference in linear-expansion coefficient between the image sensor 100C and the printed wiring board 200C. In addition, when the digital camera falls, force of impact will be applied to the bonding portions 400C. In the present embodiment, however, since the bonding portions 400C are reinforced by the resin portion 450C, the bonding portions 400C can be prevented from being broken even when the stress, caused when the temperature changes, or the force of impact, caused when the digital camera falls, is applied. Thus, the reliability of bonding of the bonding portions 400C is improved. Since the reliability of bonding of each of the bonding portions 400C is increased, the electrical and mechanical connection is kept for a long time. Therefore, the life of the printed circuit board 300C, that is, the life of the digital camera can be extended.

In addition, since the member 502C is disposed, the thermosetting resin 451C can be prevented from flowing to the portion C3 in which the image is formed. Therefore, when the image sensor 100C is removed from the printed wiring board 200C in maintenance such as repair, the image formed in the portion C3 can be checked with a scanner (not illustrated) or the like because the image is not covered with the resin. The member 501C may not be formed. However, when the member 501C is formed around the portion C3, the thermosetting resin 451C can be more effectively prevented from flowing to the portion C3.

EXAMPLES

First Example

As a first example, there was made the printed circuit board 300 of FIG. 2 by using the method of the first embodiment. The image sensor 100 of the first example is an LGA package, a bottom surface area of 900 mm², a total area of the lands 130 of 150 mm², and the number of effective terminals of 300. The effective terminals are made of solder. The insulating substrate 102 of the image sensor 100 is made of alumina ceramic.

The type of the insulating substrate 202 of the printed wiring board 200 is FR-4. The size of the outer shape of the insulating substrate 202 is about 50.0 mm×50.0 mm. The thickness of the solder resist 240 is about 0.02 mm. The material of the lands 230 is copper (Cu). The diameter of the lands 230 is 1.0 mm, and the lands 230 are arranged in a grid, with a pitch of 1.6 mm. An area of a portion surrounded by the innermost lands of the plurality of lands 230 is 180 mm².

The Step S2 of FIG. 4B will be specifically described. Here, a surface of the printed wiring board 200 on which the image sensor 100 is to be mounted is referred to as a front surface, and a surface of the printed wiring board 200 opposite to the front surface is referred to as a back surface. In Step S2, electronic components (not illustrated) including capacitors and resistors were mounted on the back surface. In Step S2, a silicone adhesive which contains silicone oil was formed on a jig (not illustrated), with the thickness of about 100 μm. On the jig, the silicone adhesive had a pattern of the member 500 which would be formed on the printed wiring board 200. Then the printed wiring board 200 was placed on the jig, and the printed wiring board 200 and the jig were conveyed into a reflow furnace. When the printed wiring board 200 was conveyed into the reflow furnace, the front surface of the printed wiring board 200 was in contact with the silicone adhesive formed on the jig, and the electronic components including capacitors and resistors were placed on the back surface of the printed wiring board 200. Then the printed wiring board 200 was taken out of the reflow furnace, and peeled off from the jig. At this time, part of the silicone adhesive was transferred and remained onto the printed wiring board 200, and thereby the member 500 was formed, with a thickness of about 0.1 to 10 μm and a width of about 2 mm.

In Step S3 of FIG. 4C, the paste P was screen-printed on the lands 230. In the screen printing, a printing plate with a thickness of 0.02 mm was used. The paste P contains bisphenol A epoxy resin which serves as a thermosetting resin, and a curing agent which reacts with the epoxy resin. The alloy composition of the solder powder is a tin-58bismuth eutectic composition with a melting point of 139° C. The average size of particles of the solder powder is 40 μm. The amount of the solder powder of the paste P is about 40 volume percent, and the rest is the thermosetting resin, the curing agent, and a slight amount of flux component used to ensure solder bonding capability.

In Step S4 of FIG. 5A, the image sensor 100 with the LGA package was placed on the printed wiring board 200 with the paste P, by using a mounter. At this time, the lands 130 were positioned at positions which faced positions of the lands 230 of the printed wiring board 200 to be bonded with the image sensor 100.

Figure 22:
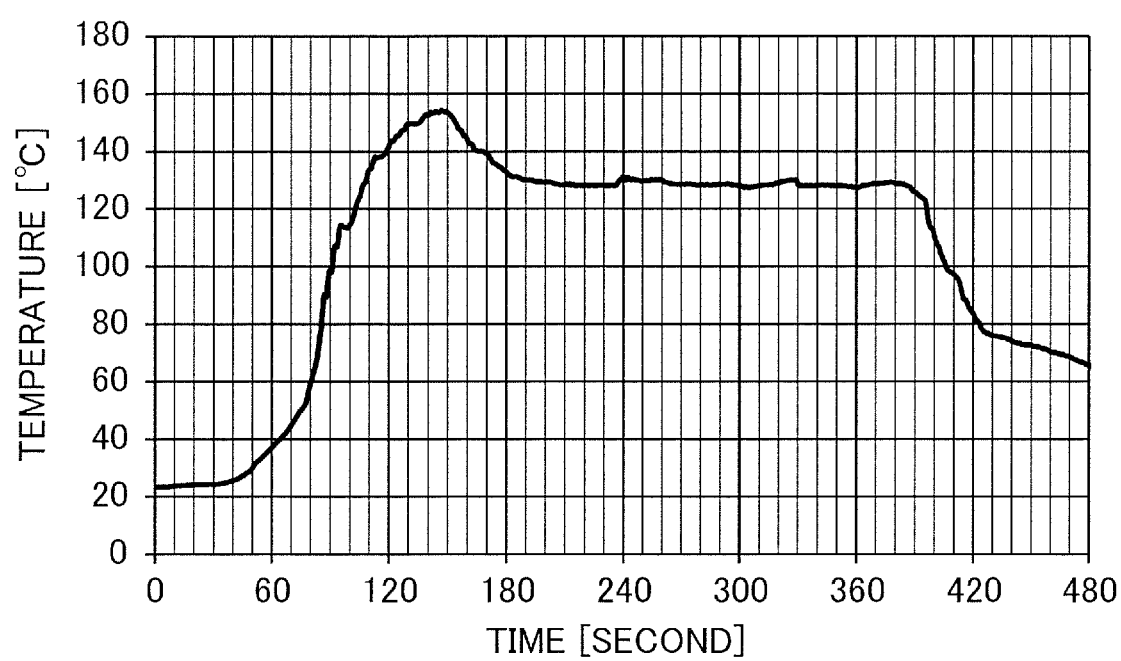
FIG. 22 is a graph illustrating the temperature of the interior of a reflow furnace of examples.

Then, in Step S5-1 illustrated in FIG. 5B and Step S5-2 illustrated in FIG. 5C, the paste P was heated. FIG. 22 illustrates a temperature profile of the reflow furnace 1000, used in Step S5-1 and Step S5-2. FIG. 22 is a graph illustrating the temperature of the interior of the reflow furnace 1000 of the examples. In Step S5-1, as illustrated in FIG. 22, the temperature of the interior of the reflow furnace 1000 was adjusted to a temperature equal to or higher than the solder melting point of 139° C., to melt the solder of the paste P. With this operation, the paste P was separated into the molten solder 401 and the thermosetting resin 451. In Step S5-2, as illustrated in FIG. 22, the temperature of the interior of the reflow furnace 1000 was adjusted to a temperature lower than the solder melting point of 139° C. and necessary to cure the thermosetting resin 451, to harden the thermosetting resin 451.

As illustrated in FIGS. 6A and 6B, the printed circuit board 300 made by using the above-described method was disassembled into the image sensor 100 and the printed wiring board 200. Then the thermosetting resin having adhered to the image sensor 100 and the printed wiring board 200 was examined. As a result, the thermosetting resin having adhered to the printed wiring board 200 was not observed in the inside of the member 500, indicating that the resin had not flowed over the member 500. In addition, the thermosetting resin having adhered to the bottom surface of the image sensor 100 was not observed in a portion corresponding to the portion located inside the member 500, indicating that the resin had not flowed into the portion of the image sensor 100. Furthermore, the bonding portions 400 were entirely covered with the resin portion 450. In the first example, since the bonding portions 400 are covered with the resin portion 450, the bonding strength for the printed circuit board 300 is increased.

Second Example

As a second example, there was made the printed circuit board 300A of FIG. 7 by using the method of the second embodiment. The image sensor 100A of the second example is an LCC package. The insulating substrate 102A of the image sensor 100A is made of alumina ceramic. The lands 130A illustrated in FIG. 8A have a size of 1.8 mm×0.6 mm, and are arranged at a pitch of 1.0 mm. The lands 130A, 131A, 132A, and 133A are made of Ni/Au by plating.

The type of the insulating substrate 202A of the printed wiring board 200A of FIG. 8B is FR-4. The size of the outer shape of the insulating substrate 202A is about 66.0 mm×45.0 mm. The thickness of the solder resist 240A is about 0.02 mm. The material of the lands 230A is copper (Cu). The size of each of the lands 230A is 2.4 mm×0.76 mm. The lands 230A are 142 in number, and arranged at a pitch of 1.0 mm. The printed wiring board 200A has the openings H1, H2, and H3 used to solder metal plates (not illustrated) to the lands 131A, 132A, and 133A of the image sensor 100A. The metal plates are used for positioning. In the portion C1 illustrated in FIG. 8A, a bar-code image is formed. The opening H1 which faces the land 131A and the portion C1 is larger than the openings H2 and H3.

The lands 131A, 132A, 133A have a size of about 7 mm×4 mm. The portion C1 has a size of about 7 mm×3 mm. The opening H1 has a size of about 10 mm×10 mm. The openings H2 and H3 have a size of about 10 mm×7 mm. When viewed from the Z-direction, the member 501 illustrated in FIG. 8B is formed around the opening H1 so as to surround the land 131A and the portion C1.

The description of a component of the second example identical to a component of the first example will be omitted. In addition, since the method for manufacturing the printed circuit board 300A is the same as the method for manufacturing the first example, the description thereof will be omitted.

As illustrated in FIGS. 11A and 11B, the printed circuit board 300A made by using the above-described method was disassembled into the image sensor 100A and the printed wiring board 200A. Then the thermosetting resin having adhered to the image sensor 100A and the printed wiring board 200A was examined. As a result, the thermosetting resin having adhered to the printed wiring board 200A was not observed in the inside of the members 501, 502, and 503, indicating that the resin had not flowed over the members 501, 502, and 503. In addition, the thermosetting resin having adhered to the bottom surface of the image sensor 100A was not observed in portions corresponding to the portions located inside the members 501, 502, and 503, indicating that the resin had not flowed into the portions of the image sensor 100A. That is, the resin had not flowed into the portion C1, and the lands 131A, 132A, and 133A.

Thus, since the resin had not flowed into the portion C1, the bar-code image was able to be normally read by a scanner (not illustrated). In addition, the lands 131A, 132A, and 133A were able to be normally soldered to the metal plates (not illustrated). Furthermore, the bonding portions 400A were entirely covered with the resin portion 450A. In the second example, since the bonding portions 400A are covered with the resin portion 450A, the bonding strength for the printed circuit board 300A is increased.

Third Example

As a third example, there was made the printed circuit board 300B of FIG. 12 by using the method of the third embodiment. The image sensor 100B of the third example is an LGA package. In the portion C2, a QR code (registered trademark) is formed. The portion C2 has a size of 7 mm×7 mm. The member 500B is disposed so as to surround a portion which faces the portion C2 and has a size of 7 mm×7 mm, and has a width of 2 mm.

The description of a component of the third example identical to a component of the first example will be omitted. In addition, since the method for manufacturing the printed circuit board 300B is the same as the method for manufacturing the first example, the description thereof will be omitted.

As illustrated in FIGS. 16A and 16B, the printed circuit board 300B made by using the above-described method was disassembled into the image sensor 100B and the printed wiring board 200B. Then the thermosetting resin having adhered to the image sensor 100B and the printed wiring board 200B was examined. As a result, the thermosetting resin having adhered to the printed wiring board 200B was not observed in the inside of the member 500B, indicating that the resin had not flowed over the member 500B. In addition, the thermosetting resin having adhered to the bottom surface of the image sensor 100B was not observed in a portion corresponding to the portion located inside the member 500B, indicating that the resin had not flowed into the portion of the image sensor 100B. That is, the resin had not flowed into the portion C2.

Thus, since the resin had not flowed into the portion C2, the QR-code (registered trademark) image was able to be normally read by a scanner (not illustrated). Furthermore, the bonding portions 400B were entirely covered with the resin portion 450B. In the third example, since the bonding portions 400B are covered with the resin portion 450B, the bonding strength for the printed circuit board 300B is increased.

Fourth Example

As a fourth example, there was made the printed circuit board 300C of FIG. 17 by using the method of the fourth embodiment. The image sensor 100C of the fourth example is an LGA package. In the portion C3, a DataMtrix-code image is formed. The portion C3 has a size of 7 mm×7 mm. Around the portion C3, the member 501C is formed. The member 502C is formed on the whole area of a portion of the printed wiring board 200C; the portion has a size of 8 mm×8 mm and includes the outer circumference of a portion of the printed wiring board 200C corresponding to the portion C3.

The description of a component of the fourth example identical to a component of the first example will be omitted. In addition, since the method for manufacturing the printed circuit board 300C is the same as the method for manufacturing the first example, the description thereof will be omitted.

As illustrated in FIGS. 21A and 21B, the printed circuit board 300C made by using the above-described method was disassembled into the image sensor 100C and the printed wiring board 200C. Then the thermosetting resin having adhered to the image sensor 100C and the printed wiring board 200C was examined. As a result, the thermosetting resin having adhered to the printed wiring board 200C was not observed in the inside of the member 502C, indicating that the resin had not flowed into the member 502C. In addition, the thermosetting resin having adhered to the bottom surface of the image sensor 100C was not observed in a portion corresponding to the portion located inside the member 501C, indicating that the resin had not flowed into the portion of the image sensor 100C. That is, the resin had not flowed into the portion C3.

Thus, since the resin had not flowed into the portion C3, the DataMtrix-code image was able to be normally read by a scanner (not illustrated). Furthermore, the bonding portions 400C were entirely covered with the resin portion 450C. In the fourth example, since the bonding portions 400C are covered with the resin portion 450C, the bonding strength for the printed circuit board 300C is increased.

Comparative Example

Figure 23A:
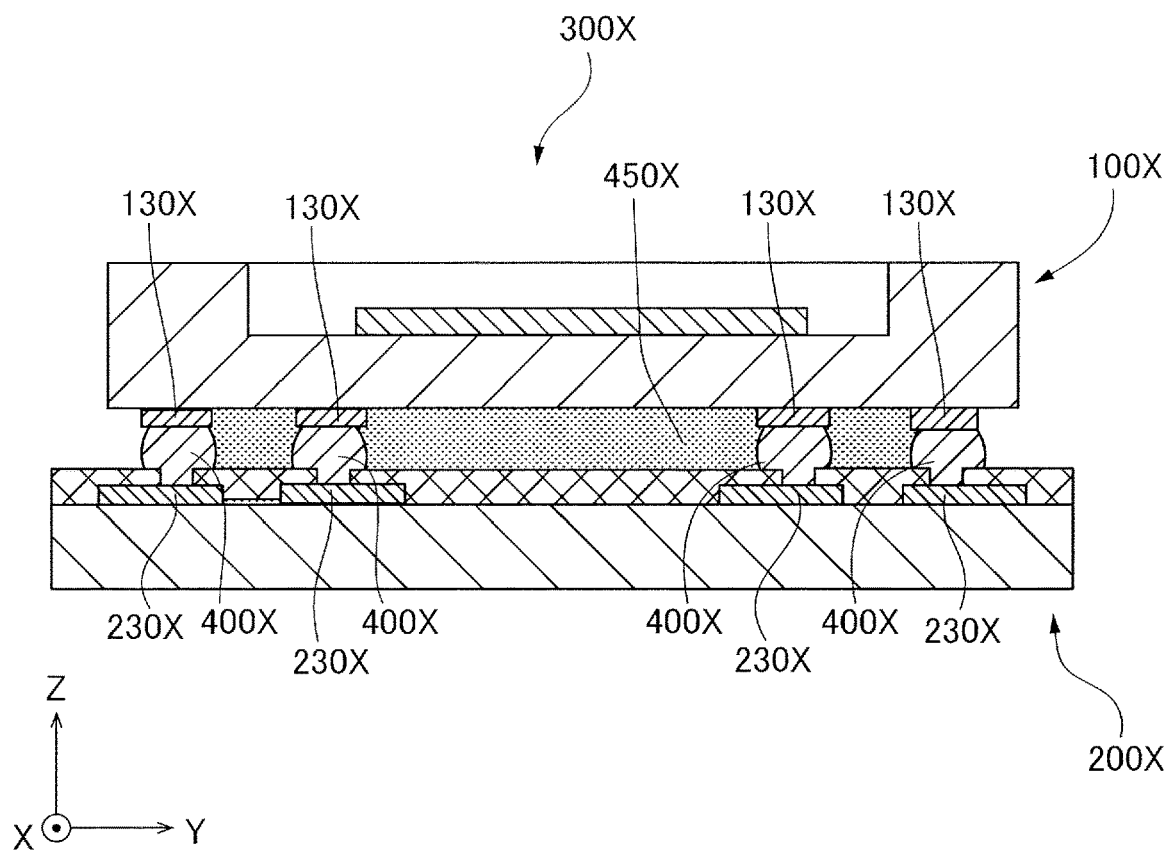
FIG. 23A is a cross-sectional view of a printed circuit board of a comparative example.

FIG. 23A is a cross-sectional view of a printed circuit board 300X of a comparative example. The printed circuit board 300X fails to have the member having a property to repel the uncured thermosetting resin. The printed circuit board 300X of the comparative example was made through the steps S1, S3, S4, S5-1, and S5-2, not though Step S2.

In the printed circuit board 300X, lands 130X of an image sensor 100X and lands 230X of a printed wiring board 200X are bonded with each other via bonding portions 400X. In addition, a resin portion 450X is disposed between the image sensor 100X and the printed wiring board 200X. However, the resin portion 450X is not observed outside the outermost ones of the bonding portions 400X.

Figure 23B:
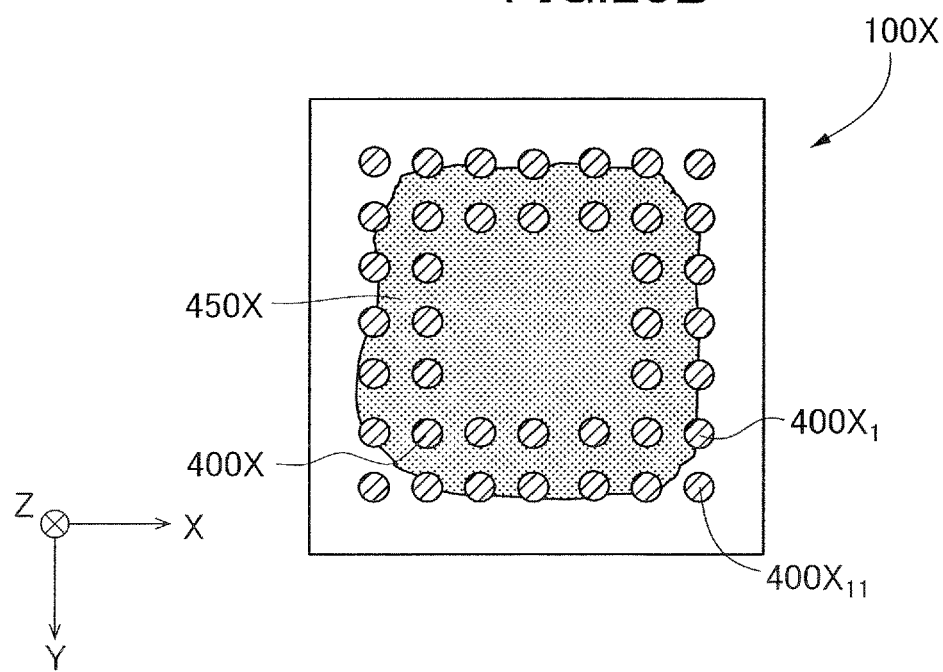
FIG. 23B is a schematic diagram of an image sensor, obtained by cutting bonding portions and a resin portion of the printed circuit board of the comparative example.

FIG. 23B is a schematic diagram of the image sensor 100X, obtained by disassembling the printed circuit board 300X into the image sensor 100X and the printed wiring board 200X. The thermosetting resin spread over a center portion of the bottom surface of the image sensor 100X, from the periphery of outermost bonding portions $400X_1$ of the plurality of bonding portions 400X. Part or all of the outermost bonding portions $400X_1$ is not covered with the resin portion 450X. In particular, the resin portion 450X is hardly formed in the periphery of bonding portions $400X_{11}$ located at corners of the image sensor 100X.

Evaluation of Printed Circuit Board

Solder bonding portions of the printed circuit boards of the first to the fourth examples made by using the above-described methods were examined with an X-ray transmission observation apparatus. As a result, any failure in bonding, such as a solder bridge formed across adjacent solder bonding portions, was not observed. In addition, the solder bonding portions were electrically tested. As a result, there was no failure in continuity.

For the first to the fourth examples, the steps S5-2, S15-2, S25-2, and S35-2 to thermally harden the resin were performed at a temperature of 130° C. which is lower than the solder melting point. As a result, the image sensor was hardly thermally-deformed, and the optical performance of the sensor element of the image sensor was sufficiently ensured.

In addition, a strength test was performed on the first to the fourth examples and the comparative example. In the strength test, peeling force was evaluated on the printed circuit boards 300, 300A, 300B, 300C, and 300X. Here, the peeling force is the force required to break a portion in which the grid-like lands are bonded with each other, and to peel off the portion from a corner portion. As a result, the peeling force for the comparative example was smaller than those for the first to the fourth examples by 10 to 40%, and thus the portion of the comparative example was easily peeled off. This is probably because the resin portion 450X was hardly formed outside the outermost bonding portions 400X, in particular, in the periphery of the bonding portions $400X_{11}$ located at the corner of the image sensor, and thus the bonded area by the resin was small.

The present invention is not limited to the above-described embodiments and examples, and can be modified within a technical spirit of the present invention. In addition, the effects described in the embodiments are merely examples of the most suitable effects produced by the present invention. Thus, the effects of the present invention are not limited to the effects described in the embodiments.

In the above-described embodiments, the printed circuit boards 300 to 300C including the image sensor as an example of electronic components have been described. However, the printed circuit boards of the present disclosure are not limited to those. For example, the printed circuit board 700 illustrated in FIG. 1 can also be made by using a method similar to those for the printed circuit boards 300 to 300C. In addition, even in a case where the electronic component is an integrated circuit (IC) memory or a power IC, the printed circuit board can be made by using a method similar to those for the printed circuit boards 300 to 300C. In addition, although the digital camera 600, which serves as an image pickup device, has been described as one example of electronic devices, the devices of the present disclosure are not limited to this. For example, the electronic device may be an image forming apparatus, such as a printer, other than the image pickup device.

In the above-described embodiments, the paste P is disposed on the printed wiring board in the process to dispose the paste P. The present disclosure, however, is not limited to this. For example, the paste P may be disposed on the electronic component. Alternatively, the paste P may be disposed on both of the printed wiring board and the electronic component.

In the first embodiment, the member to repel the uncured thermosetting resin is disposed on the printed wiring board alone. The present disclosure, however, is not limited to this. The member to repel the uncured thermosetting resin may be disposed on the electronic component alone, or both of the printed wiring board and the electronic component. The same holds true for the second and the third embodiments.

In the fourth embodiment, the member to repel the uncured thermosetting resin is disposed on both of the printed wiring board and the electronic component. The present disclosure, however, is not limited to this. For example, the member to repel the uncured thermosetting resin may be disposed on the electronic component alone or the printed wiring board alone.

In addition, since the electronic component preferably has an LGA or LCC package, the LGA or LCC package has been described in the above-described embodiments. The present disclosure, however, is not limited to this. For example, the present invention can be applied to an electronic component having a plurality of lands formed on its bottom surface.

Other Embodiments

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-089514, filed May 7, 2018, and Japanese Patent Application No. 2019-069932, filed Apr. 1, 2019, which are hereby incorporated by reference herein in their entirety.

What is claimed is:

1. An electronic device comprising:
an upper component comprising a first main surface, and a first land disposed on the first main surface, the first main surface having a first portion on which the first land is not provided;
a lower component comprising a second main surface, and a second land disposed on the second main surface, the second main surface having a second portion on which the second land is not provided;
a bonding portion configured to bond the first land and the second land;
a resin portion comprising a cured thermosetting resin, at least one portion of the resin portion being in contact with the bonding portion; and
a member formed of a material having a property to repel an uncured thermosetting resin,
wherein the member formed of the material having the property to repel the uncured thermosetting resin is disposed on one of the first portion of the first main surface and the second portion of the second main surface, and
wherein an opening is defined by the second portion of the second main surface.

2. The electronic device according to claim 1, wherein the first portion of the first main surface comprises a third portion in which an image is formed, and
wherein the at least one portion of the member formed of the material having the property to repel the uncured thermosetting resin is disposed so as to face the third portion.

3. The electronic device according to claim 1, wherein a space is defined above a surface of the member formed of the material having the property to repel the uncured thermosetting resin, and
wherein the surface faces the first portion of the first main surface on which the first land is not provided.

4. The electronic device according to claim 1, wherein the member formed of the material having the property to repel the uncured thermosetting resin contains silicone oil or fluororesin.

5. The electronic device according to claim 1, wherein the member formed of the material having the property to repel the uncured thermosetting resin is a first member,
wherein the electronic device comprises a second member disposed on a first portion of the first main surface on which the first land is not provided, and
wherein the second member has the property to repel the uncured thermosetting resin.

6. The electronic device according to claim 1, further comprising a housing.

7. The electronic device according to claim 1, wherein the upper component is an electronic component,
wherein the lower component is a printed wiring board,
wherein the first land is one of a plurality of first lands, and
wherein the second land is one of a plurality of second lands.

8. The electronic device according to claim 7, wherein the electronic component is an image sensor.

9. The electronic device according to claim 1, wherein at least one portion of the resin portion contacts the member formed of the material having the property to repel the uncured thermosetting resin, the first main surface, and the solder resist.

10. The electronic device according to claim 1, wherein at least one portion of the member formed of the material having the property to repel the uncured thermosetting resin is disposed around the opening.

11. The electronic device according to claim 10, wherein the first portion of the first main surface comprises a third portion in which an image is formed, and
wherein the opening faces the third portion.

12. An electronic device comprising:
an upper component comprising a first main surface, and a first land disposed on the first main surface, the first main surface having a first portion on which the first land is not provided;
a lower component comprising a second main surface, and a second land disposed on the second main surface, the second main surface having a second portion on which the second land is not provided;
a bonding portion configured to bond the first land and the second land;
a resin portion comprising a cured thermosetting resin, at least one portion of the resin portion being in contact with the bonding portion; and
a member formed of a material having a property to repel an uncured thermosetting resin,
wherein the member formed of the material having the property to repel the uncured thermosetting resin is disposed on the second portion of the second main surface,
wherein the first portion of the first main surface comprises a third portion in which an identification marking is formed, and
wherein an opening is defined by the second portion of the second main surface.

13. The electronic device according to claim 12, wherein the member formed of the material having the property to repel the uncured thermosetting resin is disposed so as to face the third portion.

14. The electronic device according to claim 12, wherein the member formed of the material having the property to repel the uncured thermosetting resin contains silicone oil or fluororesin.

15. The electronic device according to claim 12, wherein the member formed of the material having the property to repel the uncured thermosetting resin is a first member,
wherein the electronic device comprises a second member disposed on the first portion of the first main surface, and
wherein the second member has the property to repel the uncured thermosetting resin.

16. The electronic device according to claim 12, further comprising a housing.

17. The electronic device according to claim 12, wherein the upper component is an electronic component, wherein the lower component is a printed wiring board,
wherein the first land is one of a plurality of first lands, and
wherein the second land is one of a plurality of second lands.

18. The electronic device according to claim 12, wherein at least one portion of the resin portion contacts the member formed of the material having the property to repel the uncured thermosetting resin, the first main surface, and the solder resist.

19. The electronic device according to claim 12, wherein the member formed of the material having the property to repel the uncured thermosetting resin is disposed around the opening.

20. The electronic device according to claim 19, wherein the opening faces the third portion.

21. The electronic device according to claim 12, wherein the identification marking is at least one selected from the group consisting of a code, a character, a numeric character, and a mark.

* * * * *